(12) United States Patent
Yoon et al.

(10) Patent No.: US 11,817,519 B2
(45) Date of Patent: Nov. 14, 2023

(54) ARRAY SUBSTRATE, DIGITAL X-RAY DETECTOR INCLUDING THE SAME, AND METHOD FOR MANUFACTURING THE SAME

(71) Applicant: LG DISPLAY CO., LTD., Seoul (KR)

(72) Inventors: Jaeho Yoon, Gyeongsangbuk-do (KR); Donghyeon Jang, Jinju-si (KR); Shihyung Park, Daegu (KR); Moonsoo Kang, Daegu (KR); Donghwan Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/535,334

(22) Filed: Nov. 24, 2021

(65) Prior Publication Data

US 2022/0199848 A1    Jun. 23, 2022

(30) Foreign Application Priority Data

Dec. 18, 2020 (KR) .................. 10-2020-0178359

(51) Int. Cl.
*H01L 31/117* (2006.01)
*H01L 27/146* (2006.01)
*H10K 39/36* (2023.01)

(52) U.S. Cl.
CPC ...... *H01L 31/117* (2013.01); *H01L 27/14658* (2013.01); *H10K 39/36* (2023.02)

(58) Field of Classification Search
CPC . H01L 31/117; H01L 27/14658; H01L 27/308
See application file for complete search history.

(56) References Cited

U.S. PATENT DOCUMENTS

| 2011/0180714 A1* | 7/2011 | Okada ............... G01T 1/243 250/354.1 |
| 2014/0014847 A1* | 1/2014 | Chang ............ H01L 27/14676 257/E31.085 |
| 2015/0234056 A1* | 8/2015 | Ofuji .................. A61B 6/4233 250/361 R |
| 2020/0135796 A1 | 4/2020 | Kim et al. |

FOREIGN PATENT DOCUMENTS

KR    10-2020-0049311 A    5/2020

* cited by examiner

*Primary Examiner* — Hugh Maupin
(74) *Attorney, Agent, or Firm* — Morgan, Lewis & Bockius LLP

(57) ABSTRACT

A lower electrode of a PIN diode and a second protective layer covering the PIN diode are formed not using separate mask processes, but using the same mask process using the same mask, thereby reducing the number of mask processes and thus increasing process efficiency. Further, the lower electrode of the PIN diode is patterned and then the second protective film covering the PIN diode is patterned such that both the former patterning and the latter patterning are carried out using a single mask process, thereby reduce increase in defects due to foreign materials or stains.

18 Claims, 27 Drawing Sheets

ARRAY SUBSTRATE, DIGITAL X-RAY DETECTOR INCLUDING THE SAME, AND METHOD FOR MANUFACTURING THE SAME

CROSS-REFERENCE TO RELATED APPLICATION

This application claims a benefit under 35 U.S.C. § 119(a) of Korean Patent Application No. 10-2020-0178359 filed on Dec. 18, 2020, on the Korean Intellectual Property Office, the entirety of disclosure of which is incorporated herein by reference for all purposes.

TECHNICAL FIELD

The present disclosure relates to a method for manufacturing an array substrate for a digital X-ray detector that may reduce the number of mask processes to improve a process efficiency, and reduce deterioration of a thin-film transistor, an array substrate for a digital X-ray detector manufactured by the method, and a digital X-ray detector including the same.

DISCUSSION OF THE RELATED ART

Because X-ray is of a short wavelength, the X-ray can transmit an object easily. The transmittance of an X-ray depends on an inner density of the object. Therefore, an internal structure of the object may be observed by detecting the transmittance of the X-ray as transmitted through the object.

One of X-ray based inspection methods used in a medical field is a film printing scheme. However, in the film printing scheme, in order to check a result, an image is shot, and then a film is printed. Thus, it takes a long time to check the result. Especially, in the film printing scheme, there are many difficulties in storing and preserving the printed film.

Recently, a digital X-ray detector (DXD) using a thin-film transistor has been developed and widely used in a medical field.

The digital X-ray detector detects the transmittance of the X-ray transmitted through the object and displays an internal state of the object on a display based on the transmittance.

Therefore, the digital X-ray detector may display the internal structure of the object without using a separate film and a printed paper. Further, the DXD has an advantage that the result may be checked in real time immediately after X-ray photographing.

SUMMARY

The digital X-ray detector is formed by stacking various elements such as a thin-film transistor, and a PIN diode, and various protective layers made of organic or inorganic materials so as to have a predefined pattern.

Specifically, each of the layers may be formed by depositing a material such as metal, organic material, and inorganic material, and performing a patterning mask process using a photolithography process using a mask having a predefined pattern.

Because the digital X-ray detector is formed by stacking layers having various patterns one on top of another, multiple mask processes using multiple masks with different patterns should be involved.

In this case, the number of the mask processes should correspond to the number of the masks. Thus, as the number of masks to be used increases, the number of the mask processes that should be carried out accordingly increases.

As the number of mask processes increases in this way, a process time and a process cost increase, and thus a process efficiency decreases.

In particular, when a subsequent process does not proceed immediately after a current single process is completed, the possibility of occurrence of foreign materials or stain on an object to be processed increases due to an increase in a waiting time, resulting in an increase in defects.

Further, a large amount of hydrogen (H) may be generated in a process of depositing materials such as metals, organic materials, and inorganic materials.

When the generated hydrogen remains in a thin-film transistor, particularly, an active layer made of an oxide semiconductor material, a negative shift of the thin-film transistor may occur, resulting in a problem of deteriorating electrical characteristics.

In particular, regarding the digital X-ray detector, a large amount of hydrogen is generated in a process of forming a PIN diode, especially, a PIN layer.

Therefore, after forming the PIN layer of the PIN diode, it is necessary to effectively discharge the excessive hydrogen from the thin-film transistor to an outside.

Accordingly, embodiments of the present disclosure are directed to an array substrate, a digital x-ray detector including the same, and a method for manufacturing the same display device that substantially obviates one or more of the problems due to limitations and disadvantages of the related art.

An aspect of the present disclosure is to provide a method for manufacturing an array substrate for a digital X-ray detector that may reduce the number of mask processes to increase the process efficiency and reduce deterioration of the thin-film transistor, an array substrate for a digital X-ray detector manufactured by the method, and a digital X-ray detector including the same.

Another aspect of the present disclosure is to provide a method for manufacturing an array substrate for a digital X-ray detector that may increase process efficiency by reducing the number of mask processes, an array substrate for a digital X-ray detector manufactured by the method, and a digital X-ray detector including the same.

Another aspect of the present disclosure is to provide a method for manufacturing an array substrate for a digital X-ray detector that may reduce a process waiting time and thus reduce increase in defects due to foreign materials or stains, an array substrate for a digital X-ray detector manufactured by the method, and a digital X-ray detector including the same.

Another aspect of the present disclosure is to provide a method for manufacturing an array substrate for a digital X-ray detector in which uniform panel characteristics may be achieved while proceeding with a number of mask processes, an array substrate for a digital X-ray detector manufactured by the method, and a digital X-ray detector including the same.

Another aspect of the present disclosure is to provide a method for manufacturing an array substrate for a digital X-ray detector which may improve element performance by reducing deterioration of an element due to hydrogen contained in a thin-film transistor, an array substrate for a digital X-ray detector manufactured by the method, and a digital X-ray detector including the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a method for manufacturing an array substrate for a digital X-ray detector comprises providing a base substrate having an active area; forming a thin-film transistor on the base substrate and in the active area; forming a first protective layer on the base substrate so as to cover the thin-film transistor; forming a lower electrode film on the first protective layer; forming a PIN (P-type/I-type/N-type semiconductors) layer and an upper electrode on the lower electrode film and in the active area; forming a second protective film on the lower electrode film so as to cover the PIN layer and the upper electrode; and patterning the second protective film to form a second protective layer, and patterning the lower electrode film to form a lower electrode in the active area.

In this connection, the second protective film and the lower electrode film are patterned using the same mask process.

Alternatively, after patterning the second protective film, the lower electrode film is patterned. In this connection, the second protective film is patterned using dry etching, and the lower electrode film is patterned using wet etching.

In another aspect, an array substrate for a digital X-ray detector comprises a base substrate having an active area and a pad area; a thin-film transistor disposed on the base substrate and in the active area; a first protective layer covering the thin-film transistor and disposed in the active area and the pad area; a PIN diode electrically connected to the thin-film transistor and disposed on the first protective layer and in the active area; and a second protective layer covering the PIN diode and disposed in the active area and the pad area.

In this connection, the second protective layer does not contact the first protective layer.

Further, the PIN diode includes a lower electrode, a PIN layer, and an upper electrode. The second protective layer does not cover a side face of the lower electrode.

In this way, the second protective film and the lower electrode film are patterned using the same mask process. After the PIN layer is formed, the second protective film is patterned to form a dehydrogenation path, thereby improving the process efficiency and effectively discharging the hydrogen from the thin-film transistor.

According to an embodiment of the present disclosure, the lower electrode of the PIN diode and the second protective layer covering the PIN diode are formed not using separate mask processes, but using the same mask process using the same mask, thereby reducing the number of mask processes and thus increasing the process efficiency.

Further, according to an embodiment of the present disclosure, the lower electrode of the PIN diode is patterned and then the second protective film covering the PIN diode is patterned such that both the former patterning and the latter patterning are carried out using a single mask process, thereby reduce increase in defects due to foreign materials or stains.

Further, according to an embodiment of the present disclosure, patterning the lower electrode of the PIN diode and the second protective layer covering the PIN diode may be carried out using the same mask, thereby secure uniform panel characteristics while performing multiple mask processes.

Further, according to an embodiment of the present disclosure, forming the PIN layer of the PIN diode and then patterning the second protective layer covering the PIN diode such that the PIN diode and the pad area are protected therewith while the thin-film transistor is not covered therewith may allow a dehydrogenation path along which hydrogen is removed from the thin-film transistor to be secured in a wider area, thereby reducing deterioration of the thin-film transistor due to the hydrogen.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Figure 1:
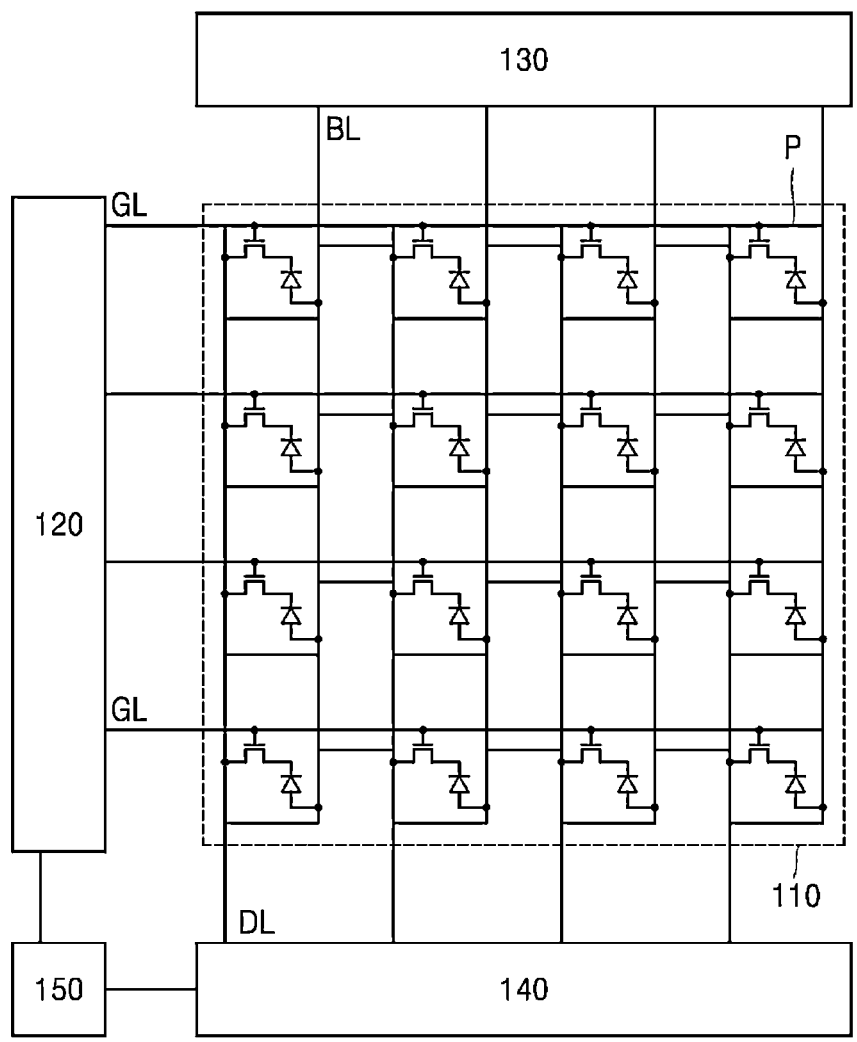
FIG. 1 is a block diagram for schematically illustrating a digital X-ray detector.

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims. A shape, a size, a ratio, an angle, a number, etc. disclosed in the drawings for describing an embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified. It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present. Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence. In descriptions of temporal relationships, for example, temporal precedent relationships between two events such as "after", "subsequent to", "before", etc., another event may occur therebetween unless "directly after", "directly subsequent" or "directly before" is indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower,"

"under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly. "X axis direction", "Y axis direction" and "Z axis direction" should not be interpreted only to have a geometric relationship in which the X axis direction, the Y axis direction, and the Z axis direction are perpendicular to each other. "X axis direction", "Y axis direction" and "Z axis direction" may be interpreted to have a broader direction within a range in which components herein may work functionally.

Hereinafter, a method for manufacturing an array substrate for a digital X-ray detector that may reduce the number of mask processes to improve a process efficiency, and reduce deterioration of a thin-film transistor, an array substrate for a digital X-ray detector manufactured by the method, and a digital X-ray detector including the same, according to some embodiments of the present disclosure will be described with reference to the drawings.

FIG. 1 is a block diagram for schematically illustrating the digital X-ray detector. The digital X-ray detector may include a thin-film transistor array 110, a gate driver 120, a bias supply 130, a readout circuitry 140, and a timing controller 150.

The thin-film transistor array 110 includes a plurality of cell regions defined by a plurality of gate lines GL arranged in a first direction and a plurality of data lines DL arranged in a second direction orthogonal to the first direction.

The cell regions are arranged in a matrix form. In each cell region, photo-sensitive pixels P may be formed. The thin-film transistor array 110 detects the X-ray emitted from an X-ray source and converts the detected X-ray into an electrical signal and outputs the electrical signal.

Each photo-sensitive pixel includes a PIN diode which converts light of a visible light region converted from the X-ray by a scintillator into an electrical signal and outputs the electrical signal, and a thin-film transistor TFT which transmits a detected signal output from the PIN diode to the readout circuitry 140. One end of the PIN diode may be connected to the thin-film transistor and the other end thereof may be connected to a bias line BL.

A gate electrode of the thin-film transistor may be connected to the gate line GL which carries a scan signal. Source/drain electrodes of the thin-film transistor may be respectively connected to the PIN diode and a data line DL which carries the detected signal output from the PIN diode. Each bias line BL may extend in a parallel manner to each data line DL.

The gate driver 120 may sequentially apply gate signals to thin-film transistors of photo-sensitive pixels through the gate lines GLs. The thin-film transistors of the photo-sensitive pixels may be turned on in response to the gate signals having a gate-on voltage level.

The bias supply 130 may apply driving voltages to the photo-sensitive pixels through the bias lines BL. The bias supply 130 may selectively apply a reverse bias or a forward bias to the PIN diode.

The readout circuitry 140 may read out the detected signal transmitted from the thin-film transistor turned on in response to the gate signal of the gate driver. That is, the detected signal output from the PIN diode may be input to the readout circuitry 140 through the thin-film transistor and the data line DL.

The readout circuitry 140 may read out the detected signal output from each of the photo-sensitive pixels during an offset readout period for reading out an offset image and a X-ray readout period for reading out the detected signal after an X-ray exposure.

The readout circuitry 140 may include a signal detector and a multiplexer. The signal detector includes a plurality of amplification circuits that correspond respectively to the data lines DL. Each amplification circuit may include an amplifier, a capacitor, and a reset element.

The timing controller 150 may generate an initiation signal and a clock signal and supply the initiation signal and the clock signal to the gate driver 120 to control an operation of the gate driver 120. Further, the timing controller 150 may generate a readout control signal and a readout clock signal, and may supply the readout control signal and the readout clock signal to the readout circuitry 140 to control an operation of the readout circuitry 140.

Figure 2:
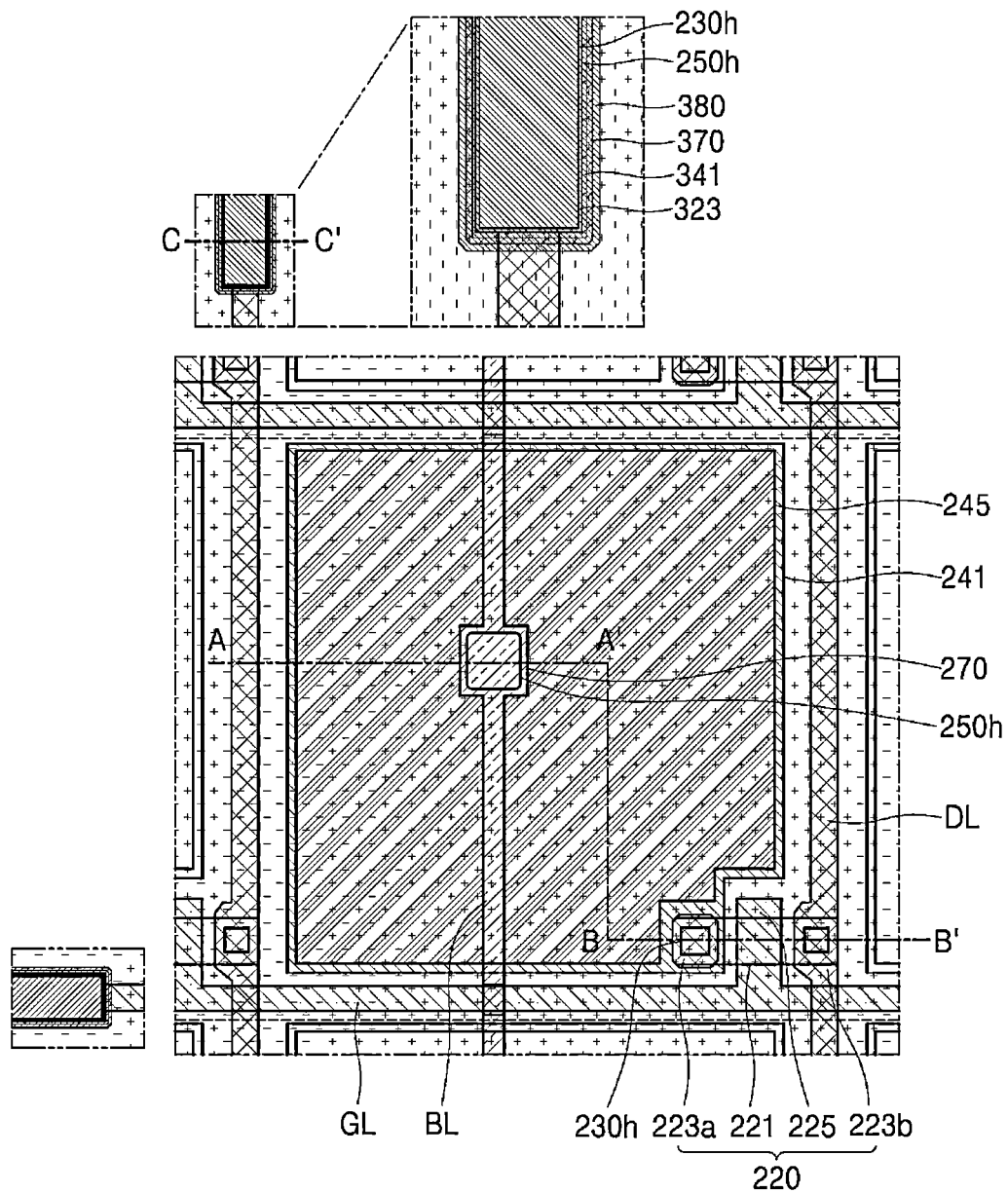
FIG. 2 is a plan view for an array substrate for a digital X-ray detector corresponding to a single pixel area and a digital X-ray detector including the same according to one embodiment of the present disclosure.
Figure 3:
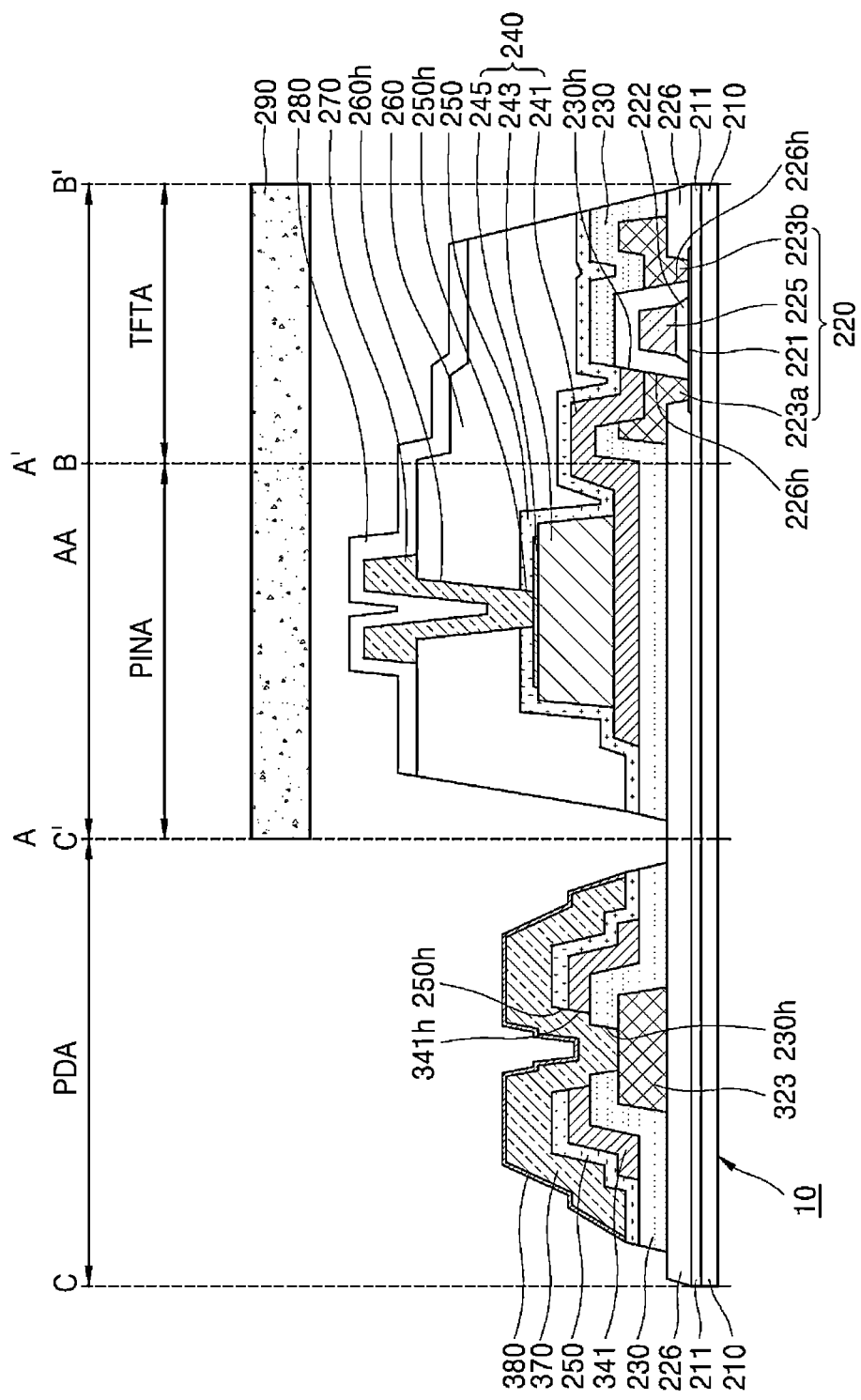
FIG. 3 is a cross-sectional view of an array substrate for a digital X-ray detector corresponding to a single pixel area and a digital X-ray detector including the same according to one embodiment of the present disclosure.

FIG. 2 is a plan view for an array substrate for a digital X-ray detector corresponding to a single pixel area and a digital X-ray detector including the same according to one embodiment of the present disclosure. FIG. 3 is a cross-sectional view of an array substrate for a digital X-ray detector corresponding to a single pixel area and a digital X-ray detector including the same according to one embodiment of the present disclosure. FIG. 4A to FIG. 4E are process plan views of a manufacturing method of an array substrate for a digital X-ray detector corresponding to a single pixel area and a digital X-ray detector including the same according to one embodiment of the present disclosure. FIG. 5A to FIG. 5E are process cross-sectional view of a manufacturing method of an array substrate for a digital X-ray detector corresponding to a single pixel area and a digital X-ray detector including the same according to one embodiment of the present disclosure.

Hereinafter, an array substrate for a digital x-ray detector, a digital x-ray detector including the same, and a method for manufacturing the same according to one embodiment of the present disclosure will be described in detail with reference to the drawings.

Hereinafter, a method for forming a pattern in each layer as described below may employ a mask process using a photolithography process including deposition, photoresist coating (PR) coating, exposure, development, etching, and photoresist stripping (PR strip) processes as conventionally performed by a person skilled in the art. Thus, detailed descriptions of each of the processes are omitted.

For example, for the deposition process, a sputtering scheme may be used for a metallic material, while a plasma enhanced chemical vapor deposition (PECVD) may be used for a semiconductor or an insulating film.

Further, for the etching process, the dry etching and the wet etching may be selectively used, based on a material. A technique performed by a person skilled in the art may be applied to the etching process.

Figure 4A:
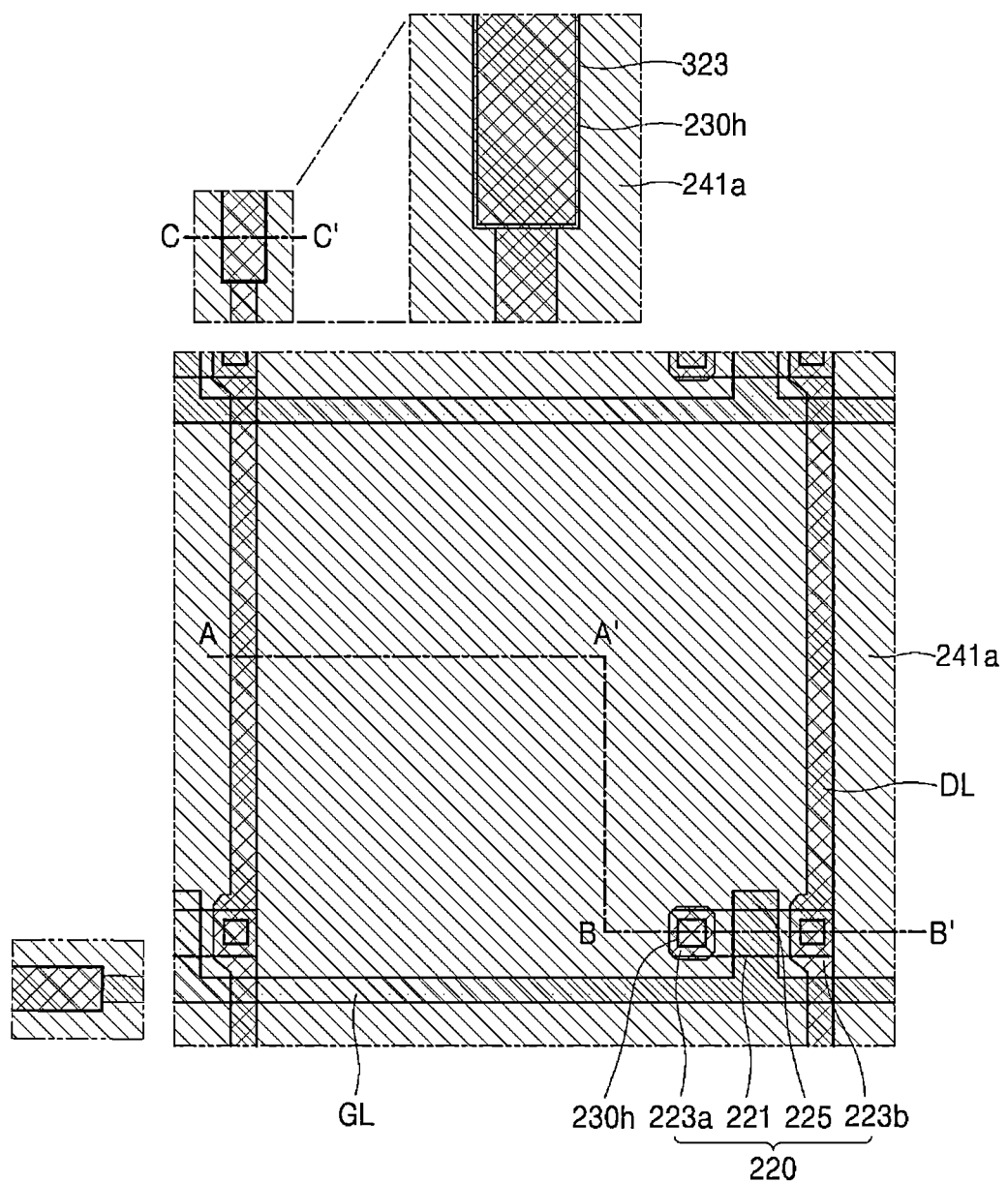
FIG. 4A to FIG. 4E are process plan views of a manufacturing method of an array substrate for a digital X-ray detector corresponding to a single pixel area and a digital X-ray detector including the same according to one embodiment of the present disclosure.
Figure 5A:
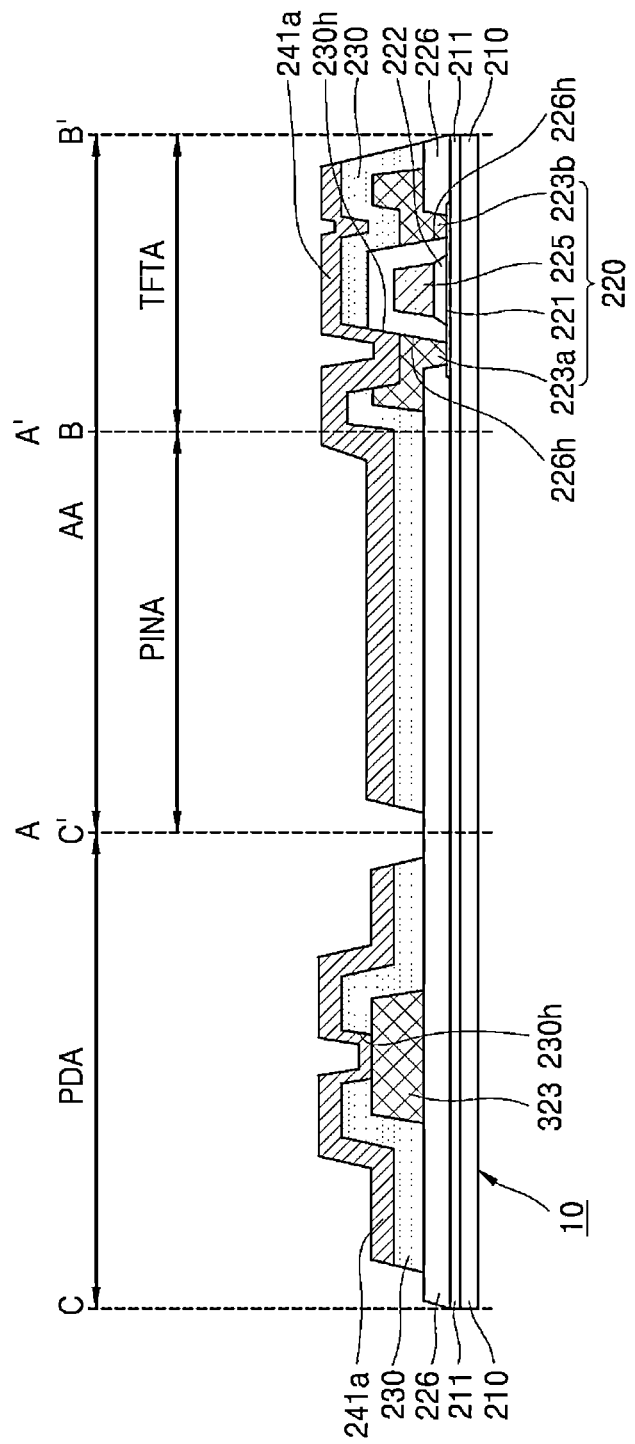
FIG. 5A to FIG. 5E are process cross-sectional view of a manufacturing method of an array substrate for a digital X-ray detector corresponding to a single pixel area and a digital X-ray detector including the same according to one embodiment of the present disclosure.

As shown in FIG. 4A and FIG. 5A, in a digital X-ray detector and an array substrate 10 for the digital X-ray detector, a thin-film transistor 220 is formed in an active area AA of a base substrate 210.

The array substrate 10 for the digital X-ray detector includes the base substrate 210.

The base substrate 210 may embodied as a glass substrate. However, the present disclosure is not limited thereto. When the array substrate 10 is applied to a flexible digital X-ray detector, the substrate 210 may be made of a polyimide material having a flexible property.

The base substrate 210 includes the active area AA and a pad area PDA.

The active area AA includes a PIN diode area PINA where a PIN diode 240 is disposed, and a thin-film transistor area TFTA where a thin-film transistor 220 is disposed.

The pad area includes a readout pad area including a readout pad area connected to the readout circuitry 140 to readout a signal to the readout circuitry 140, and a gate pad area including a gate pad area that receives a scan signal from the gate driver 120.

Hereinafter, components included in the active area AA will be first described.

A plurality of gate lines GL and a plurality of data lines DL are formed on the base substrate 210 and cross each other in a perpendicular manner to each other.

A plurality of cell areas are respectively defined at the intersections between the plurality of gate lines GL and the plurality of data lines DL. Each cell area may correspond to a pixel P. Thus, a plurality of pixel areas may be defined. An area corresponding to each of the gate line GL and the data line DL may be defined as a boundary area between pixel areas.

Each thin-film transistor 220 and each PIN diode 240 may belong to each pixel. Thus, a plurality of thin-film transistors 220 and a plurality of PIN diodes 240 may be formed in the array substrate having the plurality of pixel areas.

Hereinafter, following descriptions are based on the thin-film transistor 220 and the PIN diode 240 corresponding to the single pixel, and thus are equally applied to a pixel adjacent thereto unless otherwise specified.

On the base substrate 210, the thin-film transistor 220 including a first electrode 223a, a second electrode 223b, a gate electrode 225 and an active layer 221 is formed.

A buffer layer 211 may be formed between the base substrate 210 and the thin-film transistor 220. In this case, the buffer layer 211 may be composed of an inorganic material film such as a silicon oxide film $SiO_x$ or a silicon nitride film $SiN_x$, and may be embodied as a multi-layered buffer layer.

The active layer 221 is formed on the buffer layer 211. The active layer 221 may be made of an oxide semiconductor material such as IGZO (Indium Gallium Zinc Oxide), but is not limited thereto. The active layer 221 may be made of LTPS (Low Temperature Polycrystalline Silicon) or amorphous silicon (a-Si).

The gate electrode 225 may be formed on the active layer 221. A gate insulating layer 222 may be formed between the active layer 221 and the gate electrode 225, so that the active layer 221 and the gate electrode 225 may be insulated from each other.

The gate electrode 225 may be formed on the gate insulating layer 222 so as to correspond to a channel area of the active layer 221.

The gate electrode 225 may be made of one selected from a group consisting of molybdenum (Mo), aluminum (Al), chromium (Cr), gold (Au), titanium (Ti), nickel (Ni), copper (Cu), and alloys thereof, and may be composed of a single layer or multiple layers.

The gate electrode 225 may extend from the gate line GL.

Further, the gate electrode 225 may be integrated with the gate line GL so that the gate line GL may act as the gate electrode 225. Accordingly, the gate line GL and the gate electrode 225 may constitute the same layer.

The gate insulating layer 222 made of inorganic material may be formed to correspond to the gate electrode 225, and may be formed to have an area equal to or larger than that of the gate electrode 225 for effective insulation.

The gate electrode 225 and the gate insulating layer 222 may be formed to correspond to an inner region of the active layer 221. Accordingly, both opposing areas of the active layer 221 as exposed while not being covered with the gate electrode 225, that is, both opposing ends of the active layer 221 other than the channel area thereof may act as a source area and a drain area, respectively.

The source area of the active layer 221 may be disposed closer to the PIN diode 240 than the drain area thereof may be. However, the disclosure is not limited thereto. The locations of the source area and the drain area may be interchanged with each other.

An interlayer insulating layer 226 made of an inorganic material may be formed on the gate electrode 225 to cover the base substrate 210.

The interlayer insulating layer 226 may be formed over an entire face of the base substrate 210 including the active area AA and the pad area PDA.

The first electrode 223a and the second electrode 223b may be formed on the interlayer insulating layer 226.

The first electrode 223a and the second electrode 223b may be formed respectively to correspond to both opposing sides of the active layer 221 while the gate electrode 225 is interposed therebetween.

Interlayer insulating layer contact-holes 226h respectively corresponding to the source area and the drain area of the active layer 221 may be formed in the interlayer insulating layer 226.

Accordingly, the first electrode 223a and the second electrode 223b may be connected to the source area and the drain area of the active layer 221 via the interlayer insulating layer contact-hole 226h, respectively.

Accordingly, the first electrode 223a connected to the source area may act as a source electrode, and the second electrode 223b connected to the drain area may act as a drain electrode.

The first electrode 223a and the second electrode 223b, and the data line DL may be formed using the same patterning process and using the same material, and may constitute the same layer.

In this case, the first electrode 223a may be disposed to be spaced apart from the data line DL, while the second electrode 223b may extend from the data line DL or formed in the data line DL.

The data line DL may be made of one selected from a group consisting of molybdenum (Mo), aluminum (Al), chromium (Cr), gold (Au), titanium (Ti), nickel (Ni), copper (Cu) and alloys thereof. The present disclosure is not limited thereto.

A first protective layer 230 may be formed on the thin-film transistor 220 to cover an entire face of the base substrate 210 including the active area AA and the pad area PDA.

The first protective layer 230 may be composed of an inorganic material film such as a silicon oxide film $SiO_x$ or a silicon nitride film $SiN_x$. The present disclosure is not limited thereto. The first protective layer 230 may protect the underlying thin-film transistor 220, especially, the active layer 221.

A lower electrode film 241a to form a lower electrode 241 of PIN diode 240 may be deposited on the first protective layer 230 to cover an entire face of the base substrate 210 including the active area AA and the pad area PDA.

In this case, in order to electrically connect the first electrode 223a and the lower electrode film 241a to each other, a first protective layer contact-hole 230h may be formed in the first protective layer 230 in a corresponding manner to the first electrode 223a.

Accordingly, the lower electrode film 241a may be electrically connected to the first electrode 223a via the first protective layer contact-hole 230h of the first protective layer 230.

Figure 4B:
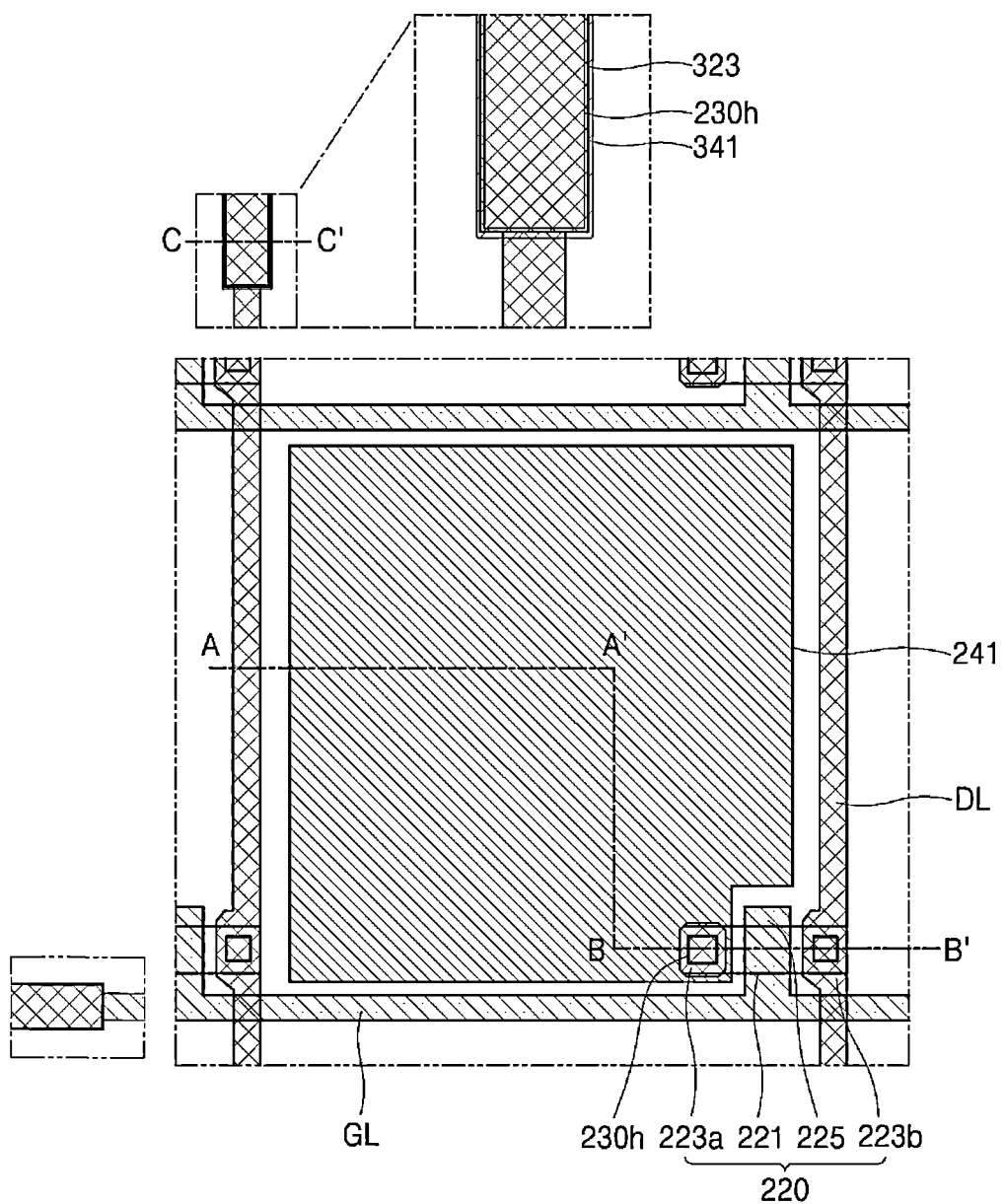
Figure 5B:
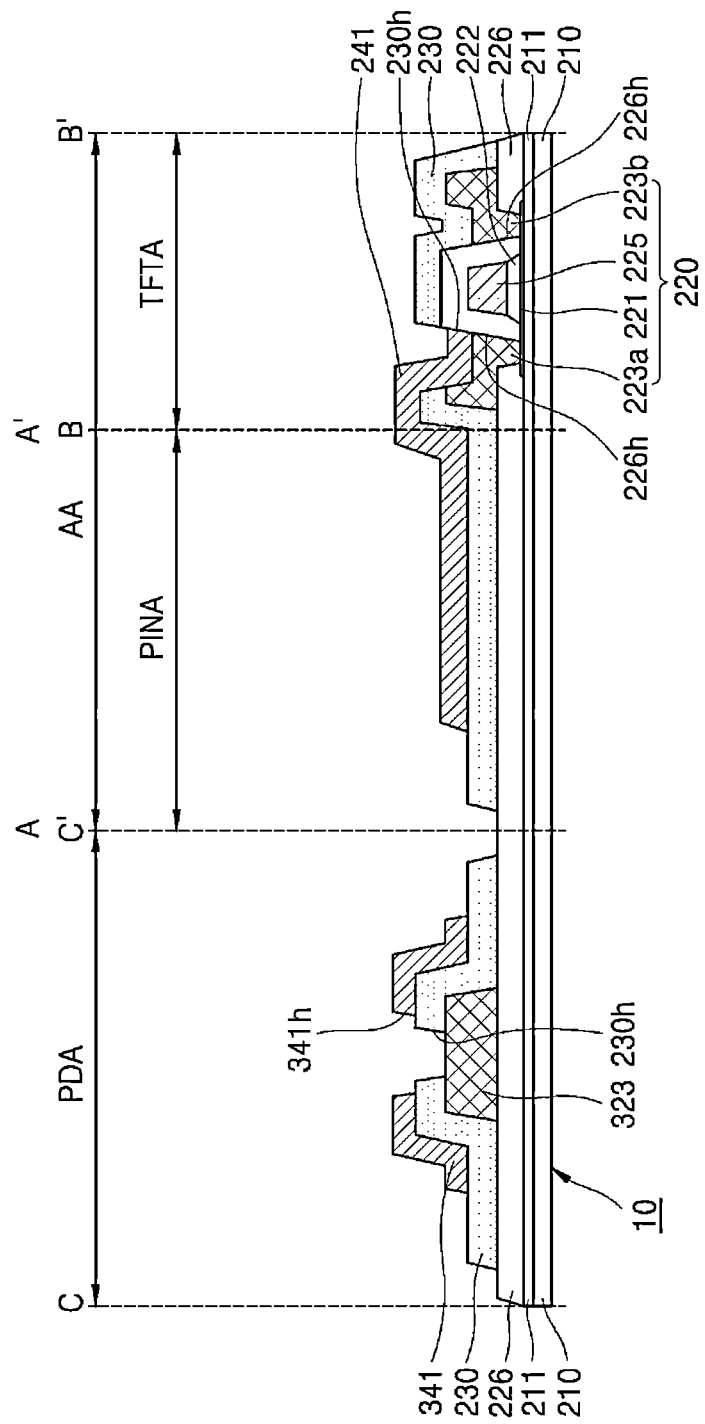

Next, as shown in FIG. 4B and FIG. 5B, the lower electrode film 241a may be patterned via a mask process using a mask having a predefined pattern, and accordingly, the lower electrode 241 may be formed.

In this case, the lower electrode film 241a may be patterned using wet etching.

The lower electrode 241 may serve as a pixel electrode in the PIN diode 240. The lower electrode 241 may be made of at least one material selected from an opaque metal such as molybdenum (Mo) or transparent oxides such as ITO (Indium Tin Oxide), IZO (Indium Zinc Oxide), and ZnO (Zinc Oxide), depending on the characteristics of the PIN diode 240.

In this case, the lower electrode 241 may be formed in a pattern corresponding to each pixel area and may be disposed in the pixel area.

Figure 4C:
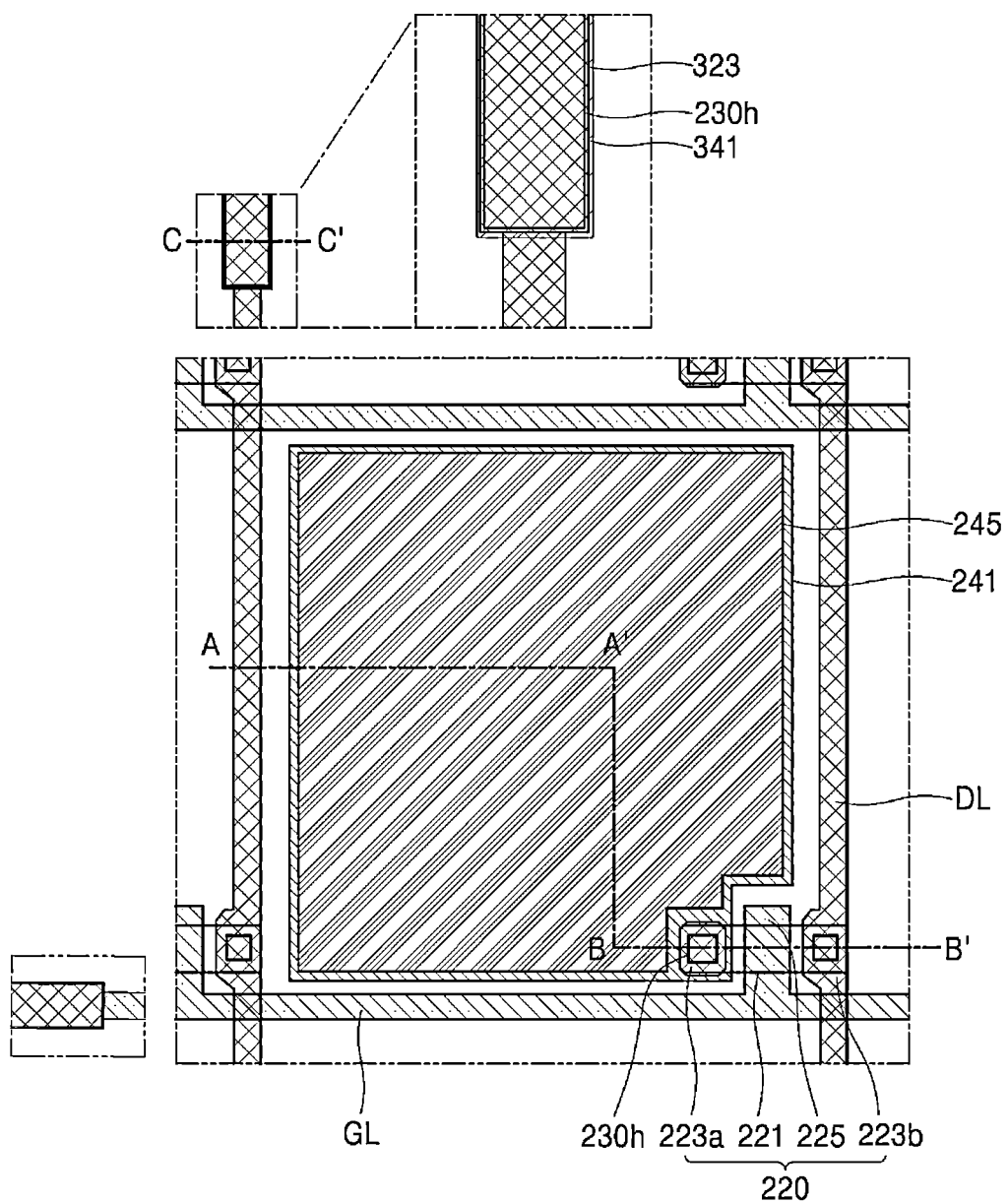
Figure 5C:
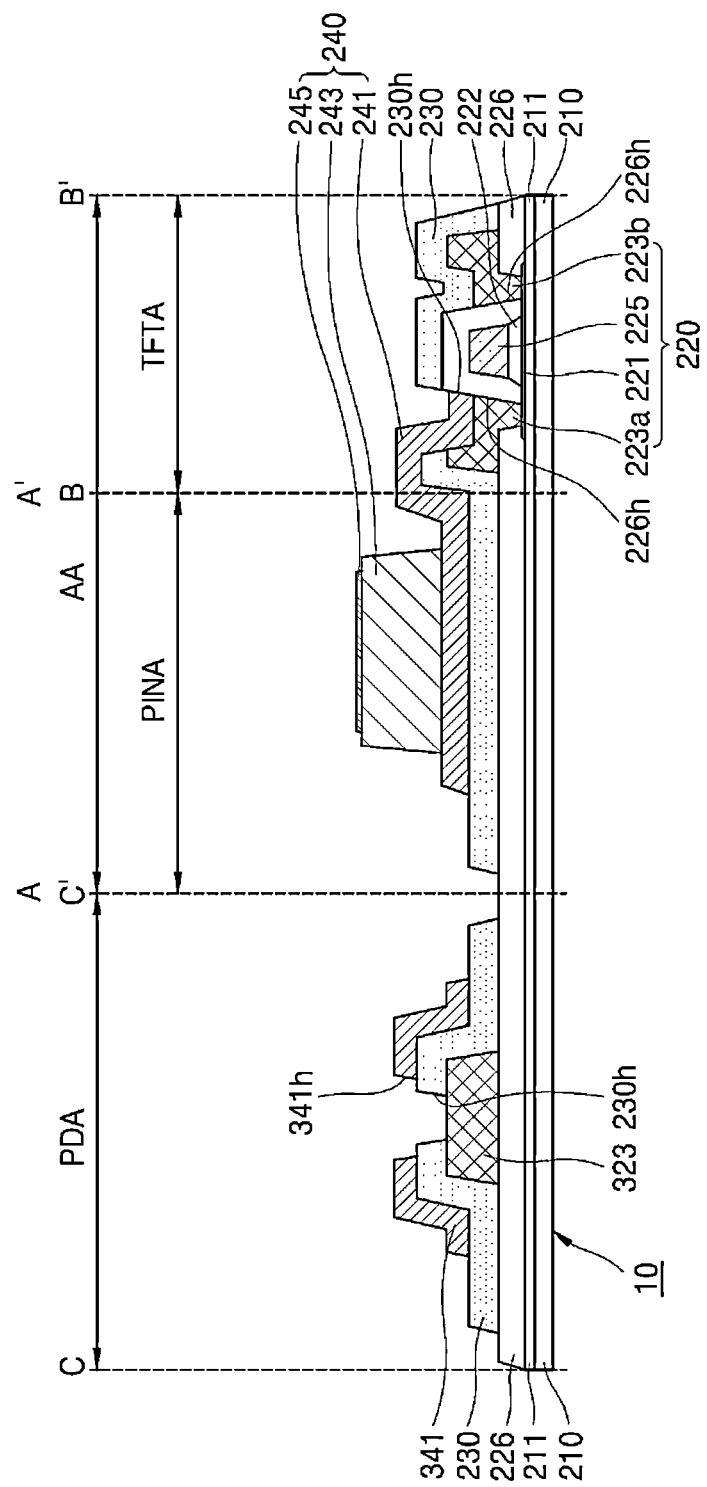

Next, as shown in FIGS. 4C and 5C, a PIN layer 243 and an upper electrode 245 of the PIN diode 240 may be formed on the lower electrode 241 and in each pixel area.

Specifically, a PIN film and an upper electrode film may be formed over the entire face of the base substrate 210 to cover the lower electrode 241. Then, the PIN film and the upper electrode film may be patterned using a mask process to form the PIN layer 243 and the upper electrode 245, respectively.

In this case, the PIN film may be patterned using dry etching, and the upper electrode film may be patterned using wet etching.

A patterning sequence of the PIN film and the upper electrode film is not particularly limited.

Accordingly, the PIN diode 240 may include the lower electrode 241 connected to the thin-film transistor 220, the PIN layer 243 on the lower electrode 241, and the upper electrode 245 on the PIN layer 243.

The PIN layer 243 converts visible light into which the scintillator converts X-ray into an electrical signal.

The PIN layer 243 may be formed by sequentially stacking an n-type semiconductor layer including n-type impurities, an intrinsic semiconductor layer, and a p-type semiconductor layer including p-type impurities on the lower electrode 241.

The intrinsic semiconductor layer may be relatively thicker than each of the n-type semiconductor layer and the p-type semiconductor layer. The PIN layer 243 may be formed to include a material capable of converting the visible light into which the scintillator converts the X-ray into the electrical signal. For example, the PIN layer 243 may include materials such as a-Se, $HgI_2$, CdTe, PbO, $PbI_2$, $BiI_3$, GaAs, and Ge.

The upper electrode 245 may be made of at least one material selected from transparent oxides such as ITO (Indium Tin Oxide), IZO (Indium Zinc Oxide), and ZnO (Zinc Oxide), so that a fill factor of the PIN diode 240 may be improved.

Figure 4D:
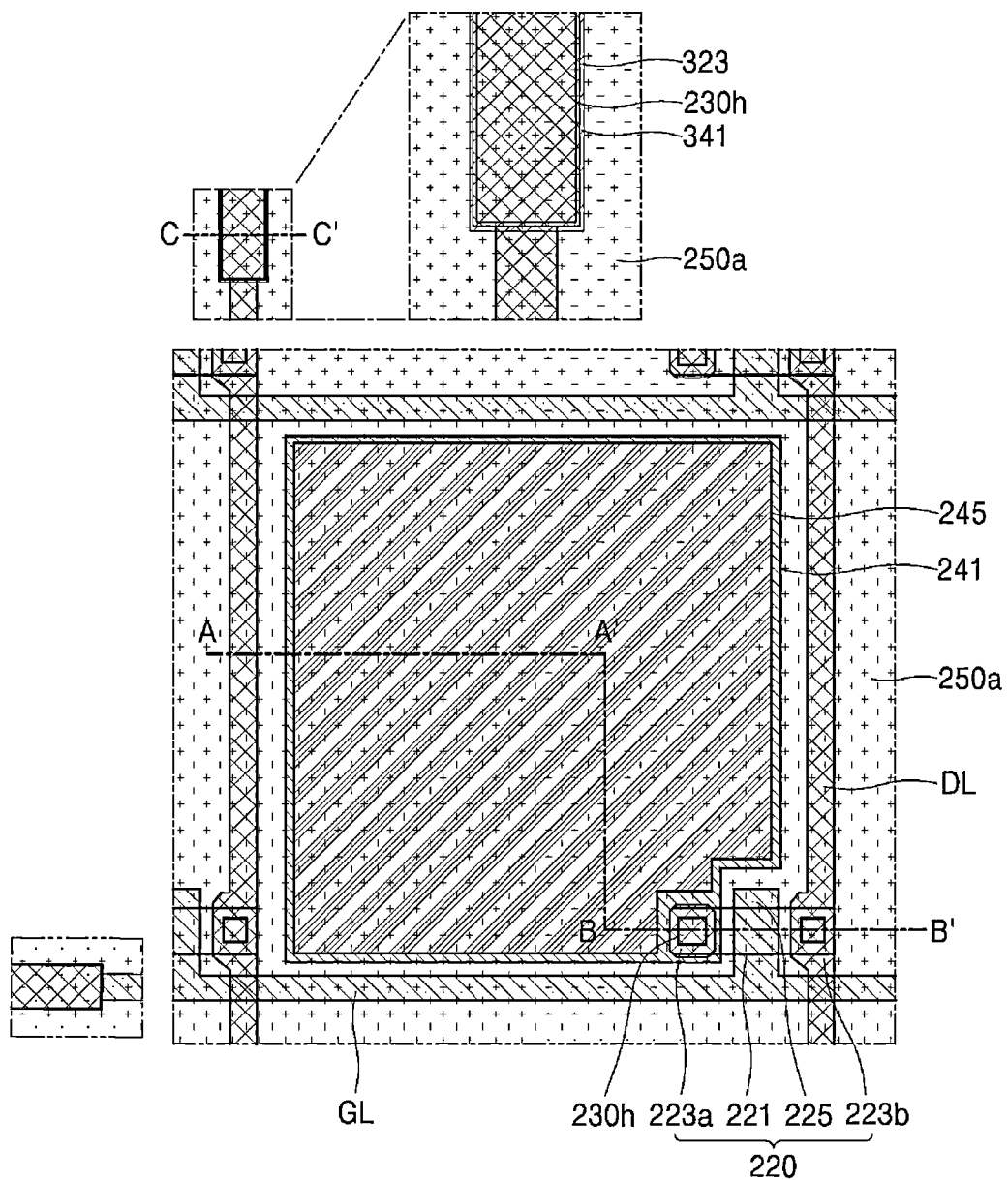
Figure 5D:
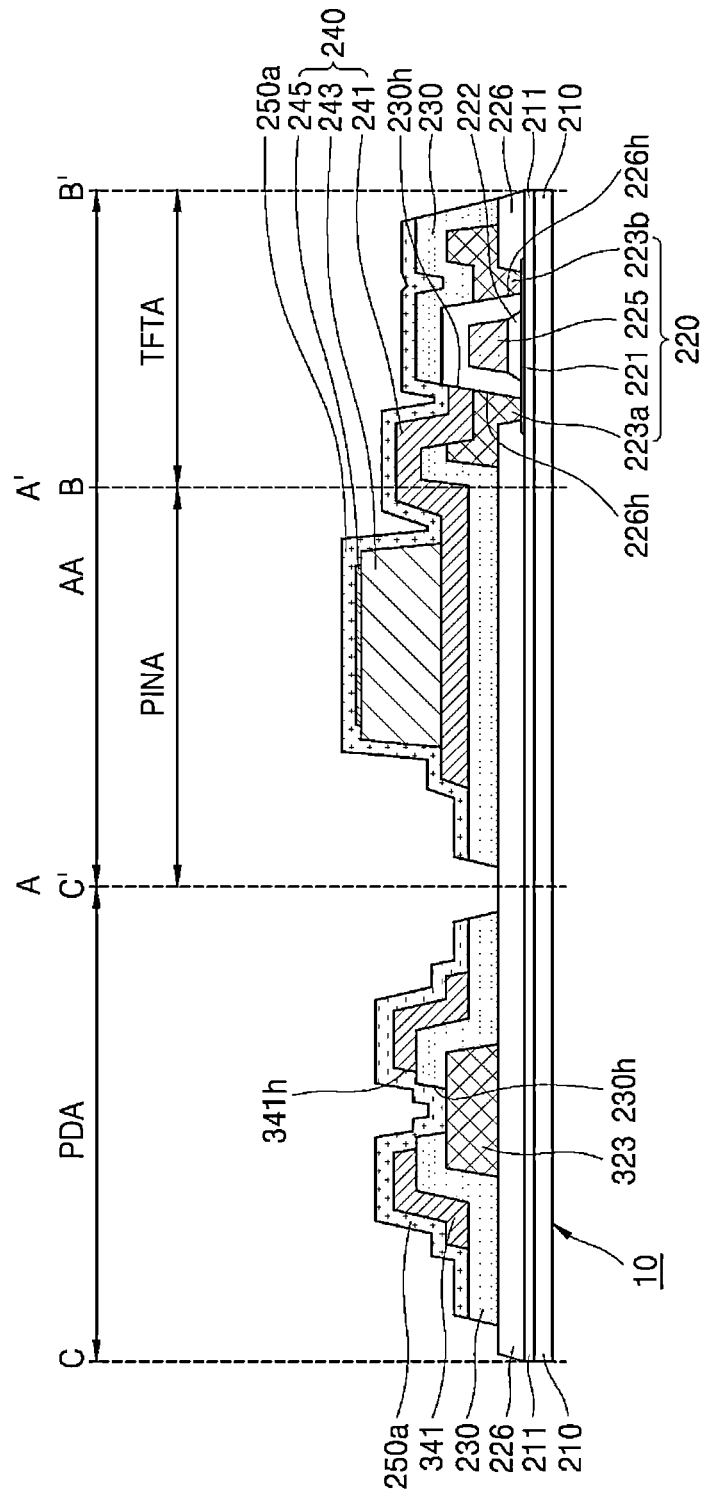

Next, as shown in FIG. 4D and FIG. 5D, a second protective film 250a may be deposited over the entire face of the base substrate 210 including the active area AA and the pad area PDA to cover the PIN diode 240.

The second protective film 250a may be composed of an inorganic material film such as a silicon oxide film $SiO_x$ or a silicon nitride film $SiN_x$. The present disclosure is not limited thereto.

Figure 4E:
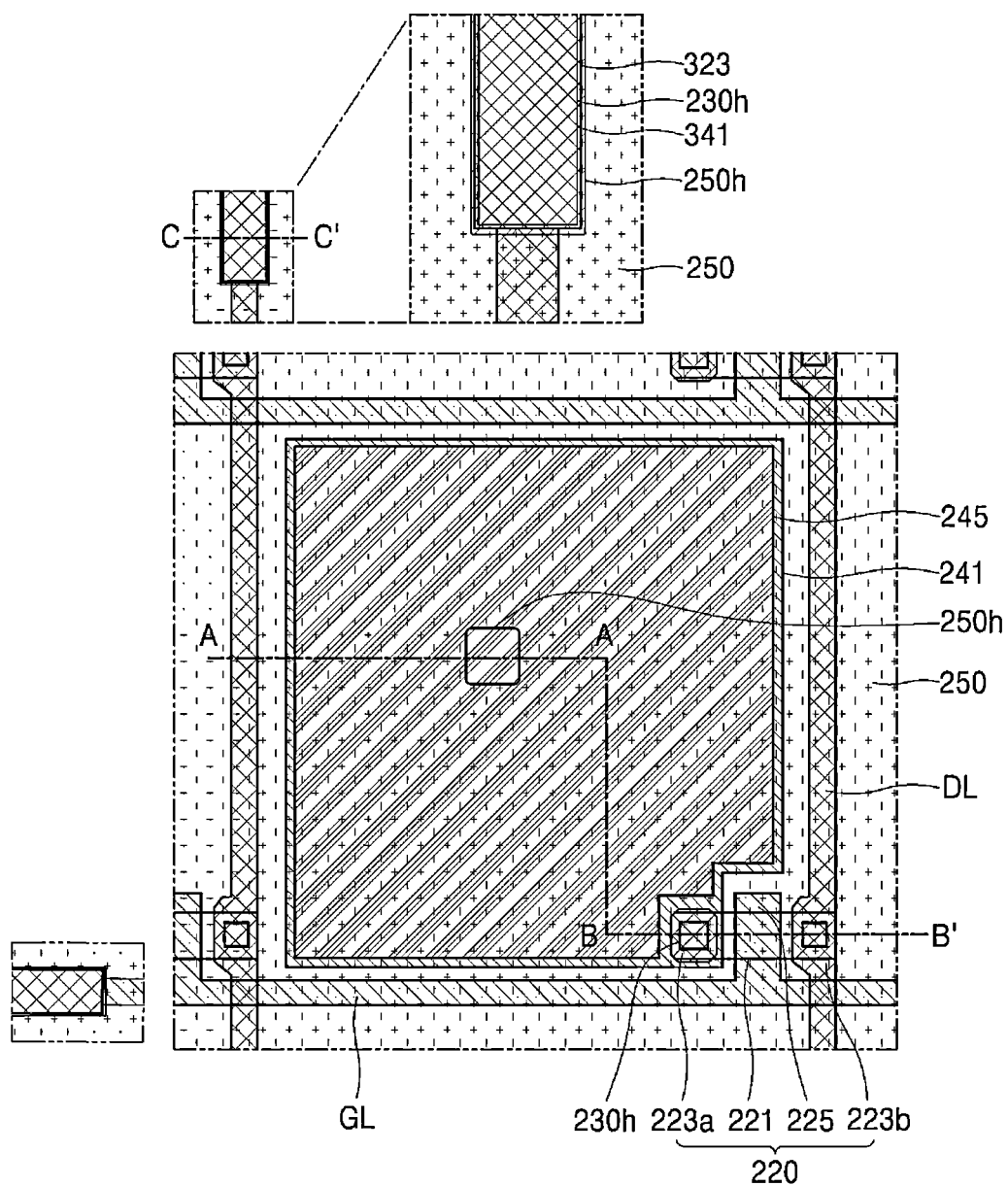
Figure 5E:
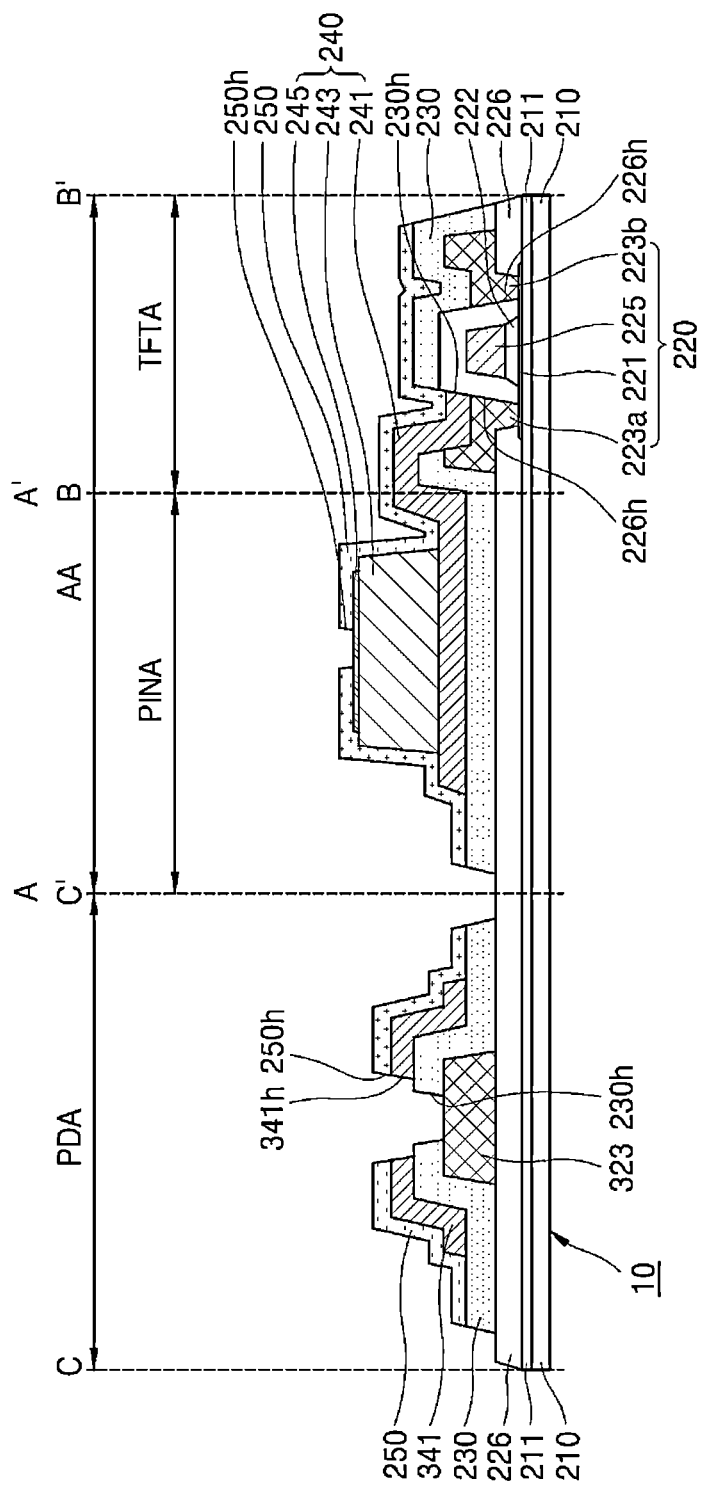

Next, as shown in FIG. 4E and FIG. 5E, a second protective layer 250 may include a second protective layer contact-hole 250h corresponding to the upper electrode 245. For example, the second protective layer contact-hole 250h may be formed by removing a portion of the second protective film 250a corresponding to the upper electrode 245. As shown in FIG. 5E, the second protective layer 250 may be formed by patterning the second protective film 250a.

In this case, the second protective film 250a may be patterned using dry etching.

The second protective layer 250 may be formed over the entire face of the base substrate 210 for except for the second protective layer contact-hole 250h, so that elements such as the PIN diode 240 and the thin-film transistor 220 below the second protective layer 250 may be protected from external moisture or foreign material.

Referring to FIG. 3, a planarization layer 260 may be formed on the second protective layer 250. The planarization layer 260 may be made of organic materials such as PAC (Photo Acryl). The present disclosure is not limited thereto.

A planarization layer contact-hole 260h may be formed in the planarization layer 260 in a corresponding manner to the second protective layer contact-hole 250h.

A bias electrode 270 may be formed on the planarization layer 260. The bias electrode 270 may be connected to the upper electrode 245 of the PIN diode 240 via the planarization layer contact-hole 260h and the second protective layer contact-hole 250h, so that a bias voltage may be applied to the PIN diode 240.

The bias electrode 270 may branch from a bias line BL extending in a parallel manner to the data line DL.

A third protective layer 280 may be formed on the bias line BL. The third protective layer 280 may be composed of an inorganic material film such as a silicon oxide film $SiO_x$ or a silicon nitride film $SiN_x$. The present disclosure is not limited thereto.

On the third protective layer 280, a scintillator layer 290 may be formed to cover the PIN diode 240.

Specifically, the scintillator layer 290 may be disposed on the thin-film transistor 220 and the PIN diode 240 and located in the active area AA so as to cover the thin-film transistor 220 and the PIN diode 240.

Because the scintillator layer 290 may be deposited directly on the array substrate 10 for the digital X-ray detector, a bottom face of the scintillator layer 290 should be planarized.

Therefore, an additional planarization layer made of an organic material such as PAC (Photo Acryl) may be formed on the third protective layer 280.

Planarizing the bottom face of the scintillator layer 290 using the additional planarization layer may facilitate the formation of the scintillator layer 290 via deposition of a scintillator material.

The scintillator layer 290 may be grown in a vertical direction to have a plurality of columnar crystal phases, so that a plurality of scintillator columnar crystals may be arranged in a side-by-side manner. The present disclosure is not limited thereto. The scintillator may be made of a material such as cesium iodide (CsI) or thallium iodide (TlI). The present disclosure is not limited thereto.

In one example, the pad area PDA includes a readout area including a readout pad, and a gate pad area including a gate pad.

Hereinafter, the readout pad in the pad area PDA will be described in detail. The description about the readout pad may be equally applied to the gate pad. Some differences therebetween will be described separately.

The pad in the readout area of the pad area PDA includes a pad electrode 323, a pad connection electrode 341, a pad contact electrode 370, and a pad protective electrode 380.

First, as shown in FIG. 4A and FIG. 5A, the pad electrode 323 may be formed on the interlayer insulating layer 226 and in the pad area PDA.

The pad electrode 323 may be formed using the same patterning process in which the first electrode 223a and the second electrode 223b are formed. Accordingly, the pad electrode 323 may have the same material as that each of the first electrode 223a and the second electrode 223b. Moreover, the pad electrode 323, the first electrode 223a, and the second electrode 223b may constitute the same layer.

However, in the gate pad area, prior to the formation of the pad electrode 323 using the same patterning process in which the first electrode 223a and the second electrode 223b are formed, a separate additional pad lower electrode may be formed using the same patterning process in which the gate electrode 225 is formed. The separate additional pad lower electrode and the gate electrode 225 may be made of the same material and may constitute the same layer.

In this case, a pad lower electrode in the gate pad area may be formed under the interlayer insulating layer 226.

After the first protective layer 230 is formed on the pad electrode 323, the lower electrode film 241a may be formed on the first protective layer 230 to cover the active area AA and an entire face of the pad area PDA.

In this case, the first protective layer contact-hole 230h may be formed in the first protective layer 230 and in the pad area PDA in a corresponding manner to the pad electrode 323. Accordingly, the lower electrode film 241a may be electrically connected to the pad electrode 323 via the first protective layer contact-hole 230h.

Next, as shown in FIG. 4B to FIG. 4C and FIG. 5B to FIG. 5C, the lower electrode film 241a may be patterned to form the pad connection electrode 341 in the pad area PDA.

Accordingly, the pad connection electrode 341 in the pad area PDA and the lower electrode 241 of the PIN diode 240 in the active area AA may constitute the same layer and may be made of the same material.

In this case, a portion of the pad connection electrode 341 corresponding to the first protective layer contact-hole 230h may be patterned and removed away to form a pad connection electrode contact-hole 341h.

Next, as shown in FIG. 4D and FIG. 5D, the second protective film 250a may be formed on the pad connection electrode 341.

The second protective film 250a may be deposited over the entire face of the base substrate 210 including the active area AA and the pad area PDA.

Next, as shown in FIG. 4E and FIG. 5E, the second protective film 250a may be patterned to form the second protective layer contact-hole 250h corresponding to the first protective layer contact-hole 230h and the pad connection electrode contact-hole 341h in the pad area PDA. Thus, the second protective layer 250 may be formed on the pad connection electrode 341.

The pad contact electrode 370 may be formed on the second protective layer 250 and in the pad area PDA.

The pad contact electrode 370 may be formed using the same patterning process in which the bias electrode 270 is formed. Accordingly, the pad contact electrode 370 and the bias electrode 270 may be made of the same material and may constitute the same layer.

The pad contact electrode 370 may be electrically connected to the lower pad electrode 323 via the first protective layer contact-hole 230h, the pad connection electrode contact-hole 341h, and the second protective layer contact-hole 250h.

The pad protective electrode 380 may be additionally disposed on the pad contact electrode 370.

The pad protective electrode 380 may protect the pad contact electrode 370 to reduce corrosion thereof, and may be made of ITO.

The digital X-ray detector according to the present disclosure operates as follows.

X-ray is irradiated to the digital X-ray detector. The scintillator layer 290 converts the X-ray into the visible light. The PIN layer 243 of the PIN diode 240 converts the light in the visible region into an electronic signal.

Specifically, when the light in the visible region is irradiated to the PIN layer 243, the I-type semiconductor layer is depleted by the P-type semiconductor layer and the N-type semiconductor layer, thereby generating an electric field therein. Then, holes and electrons generated by the light drift due to an electric field are collected into the P-type semiconductor layer and the N-type semiconductor layer, respectively.

The PIN diode 240 converts the light in the visible region into the electrical signal and transmits the signal to the thin-film transistor 220. The electrical signal thus transmitted is displayed as an image signal via the data line DL connected to the thin-film transistor 220.

Figure 6:
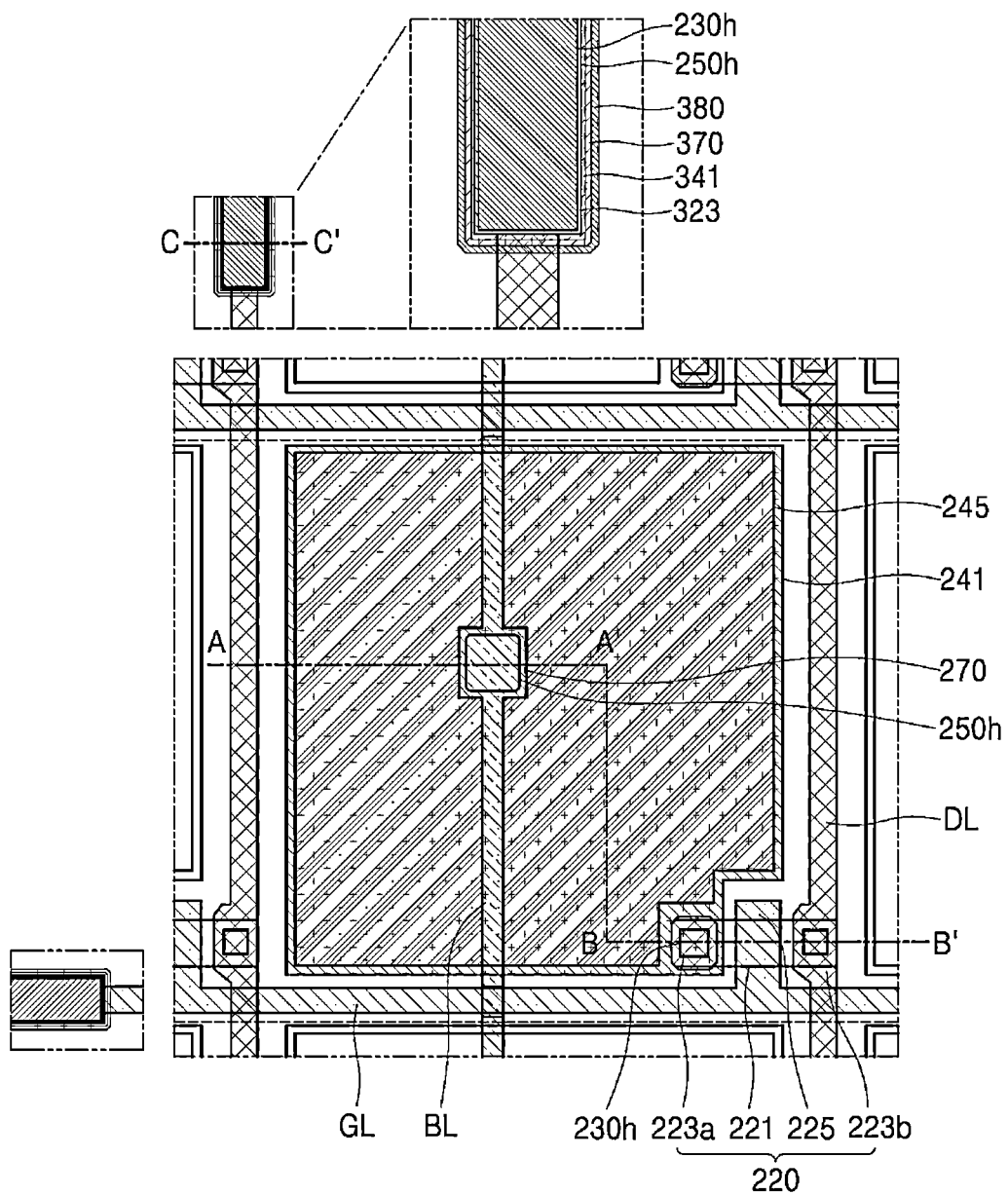
FIG. 6 is a plan view for an array substrate for a digital X-ray detector corresponding to a single pixel area and a digital X-ray detector including the same according to another embodiment of the present disclosure.
Figure 7:
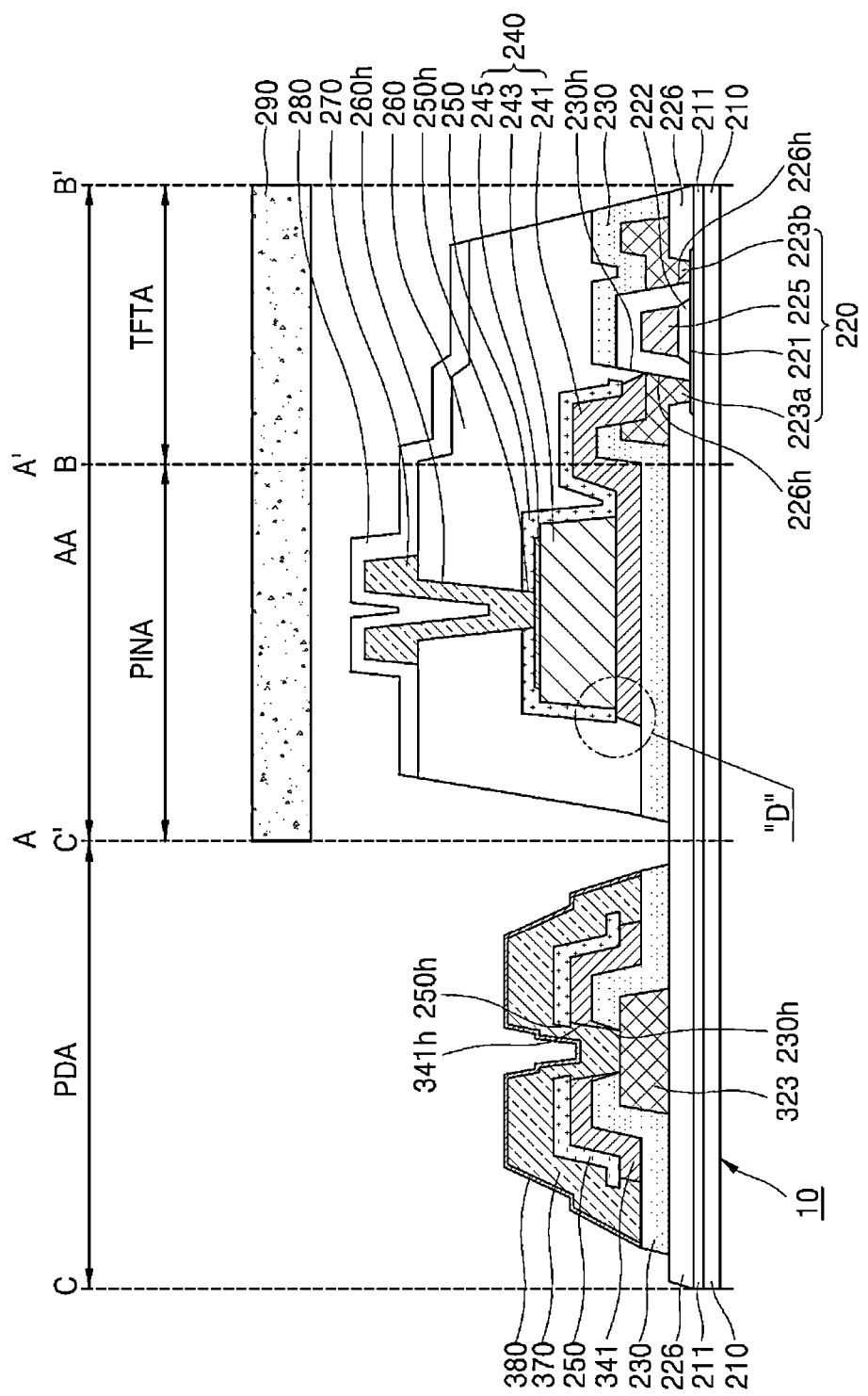
FIG. 7 is a cross-sectional view of an array substrate for a digital X-ray detector corresponding to a single pixel area and a digital X-ray detector including the same according to another embodiment of the present disclosure.

FIG. 6 is a plan view for an array substrate 10 for a digital X-ray detector corresponding to a single pixel area and a digital X-ray detector 1 including the same according to another embodiment of the present disclosure. FIG. 7 is a cross-sectional view of an array substrate 10 for a digital X-ray detector corresponding to a single pixel area and a digital X-ray detector 1 including the same according to another embodiment of the present disclosure.

FIG. 9A to FIG. 9E are process plan views of a manufacturing method of an array substrate 10 for a digital X-ray detector corresponding to a single pixel area and a digital X-ray detector including the same according to another embodiment of the present disclosure. FIG. 10A to FIG. 10E are process cross-sectional view of a manufacturing method of an array substrate 10 for a digital X-ray detector corresponding to a single pixel area and a digital X-ray detector including the same according to another embodiment of the present disclosure.

Hereinafter, with reference to the drawings, the array substrate 10 for the digital X-ray detector and the digital X-ray detector according to another embodiment of the present disclosure, and a method for manufacturing the same will be described in detail.

However, the detailed description about the content that applies identically to one embodiment of the present disclosure as described above should be omitted. Following descriptions should focus on differences therebetween.

The array substrate 10 for the digital X-ray detector, and the digital X-ray detector, and the method for manufacturing the same according to one embodiment of the present disclosure as described above may be referred to as a first embodiment. The array substrate 10 for the digital X-ray detector, and the digital X-ray detector, and the method for manufacturing the same according to another embodiment of the present disclosure as described below may be referred to as a second embodiment.

In the array substrate 10 for the digital X-ray detector, and the digital X-ray detector, and the method for manufacturing the same according to the first embodiment of the present disclosure as described above, the lower electrode 241 of the PIN diode 240 and the second protective layer 250 covering the PIN diode 240 are respectively formed using separate mask processes.

In this case, the mask process includes a deposition process and a patterning process using a photolithography process.

That is, after forming the lower electrode 241 of the PIN diode 240 via a mask process using a lower electrode pattern, the PIN layer 243 and the upper electrode 245 of the PIN diode 240 are formed using a separate mask process. Next, the second protective layer 250 covering the PIN diode 240 is formed using a separate mask process.

In the first embodiment, in the process of forming the PIN diode 240 and the second protective layer 250, the layers are respectively formed using the separate mask processes. Thus, the process efficiency may be degraded.

When a plurality of mask processes are sequentially performed, a following problem may occur for securing a process apparatus or due to other process problems: after one mask process is finished, a next mask process may not proceed immediately but may proceed after a predefined waiting time duration.

In this case, since the lower electrode 241 has been already subjected to the mask process and has been patterned, the underlying lower thin-film transistor 220 has to wait for being subjected to a next process while being exposed to an outside. Thus, for the waiting time duration, the possibility of occurrence of foreign material or stain on the array substrate may increase.

Further, in forming the lower electrode 241, the lower electrode film 241a is deposited on an entire face of the base substrate 210, and then is patterned using a photolithography process. In this connection, immediately after depositing the lower electrode film 241a, the photolithography process may not take place. Thus, for the waiting time duration, stains may occur on the lower electrode film 241a.

Figure 11:
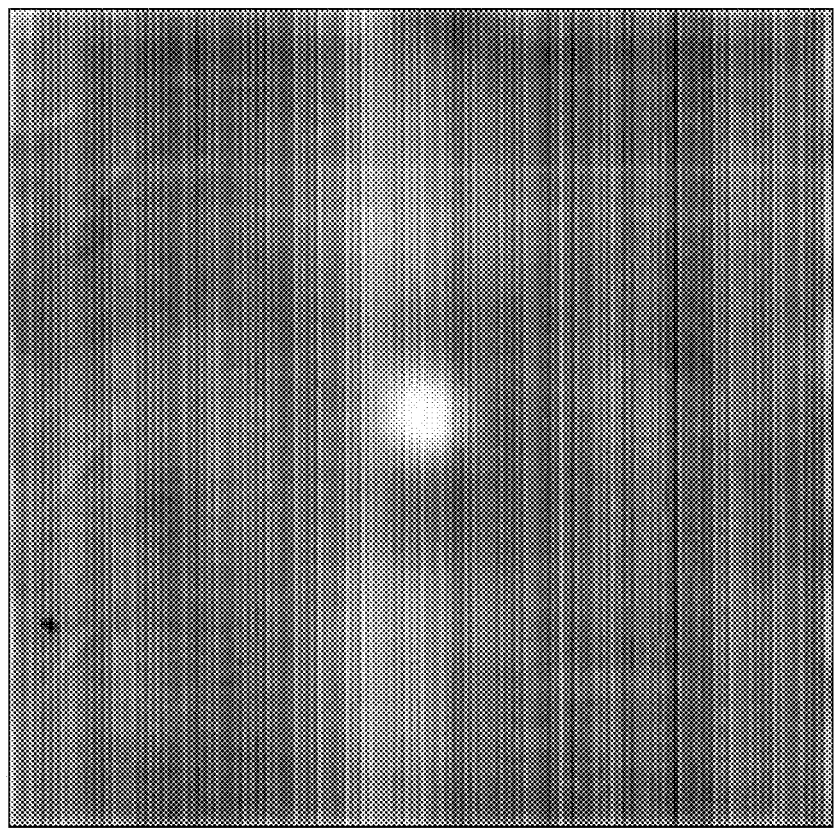
FIG. 11 is an image in a dark state when a stain is generated on an array substrate for a digital X-ray detector and a digital X-ray detector including the same.

FIG. 11 shows an image in a dark state of the array substrate 10 for the digital X-ray detector and the digital X-ray detector in the case in which, in order to form the lower electrode 241 of the PIN diode 240, the photolithography process occurs in a predefined time delay after depositing the lower electrode film 241a.

As shown in FIG. 11, in the array substrate 10 for the digital X-ray detector and the digital X-ray detector in the case which the photolithography process for the lower electrode 241 of the PIN diode 240 occurs in a predefined time delay after depositing the lower electrode film 241a, a brightness spot is recognized in a center thereof, and oblique stains are recognized.

Further, in the first embodiment, a mask process for the second protective layer 250 is performed after a mask process for the PIN layer 243 of the PIN diode 240. The second protective layer 250 is formed over the entire face of the base substrate 210 except for the contact-hole. Thus, it may be difficult to secure a dehydrogenation path that may discharge a large amount of hydrogen generated during the formation process of the PIN layer 243 to the outside.

Accordingly, in the array substrate 10 for the digital X-ray detector, and the digital X-ray detector, and the method for manufacturing the same according to the second embodiment of the present disclosure, the above problems may be removed, compared to the first embodiment of the present disclosure as described above.

To this end, the method for manufacturing the array substrate 10 for the digital X-ray detector, and the digital X-ray detector according to the second embodiment of the present disclosure may include: forming the thin-film transistor 220 in the active area AA and on the base substrate 210; forming the first protective layer 230 on the base substrate 210 to cover the thin-film transistor 220; forming the lower electrode film 241a on the first protective layer 230; forming the PIN layer 243 and the upper electrode 245 in the active area AA and on the lower electrode film 241a; forming the second protective film 250a on the lower electrode film 241a to cover the PIN layer 243 and the upper electrode 245; forming the second protective layer 250 by patterning the second protective film 250a, and forming the lower electrode 241 in the active area AA by patterning the lower electrode film 241a.

In this case, the second protective film 250a and the lower electrode film 241a are patterned using the same mask process.

Figure 9A:
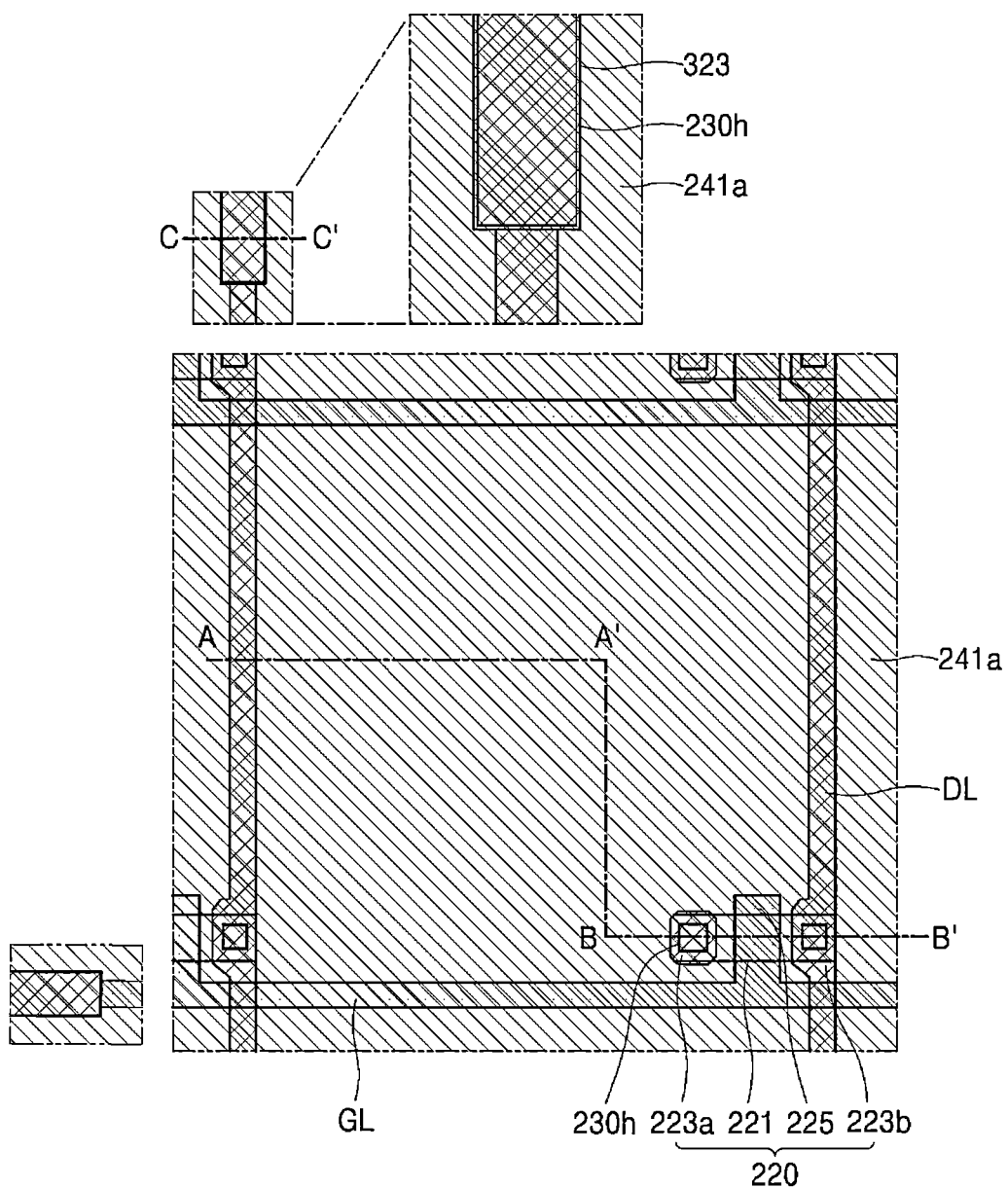
FIG. 9A to FIG. 9E are process plan views of a manufacturing method of an array substrate for a digital X-ray detector corresponding to a single pixel area and a digital X-ray detector including the same according to another embodiment of the present disclosure.
Figure 10A:
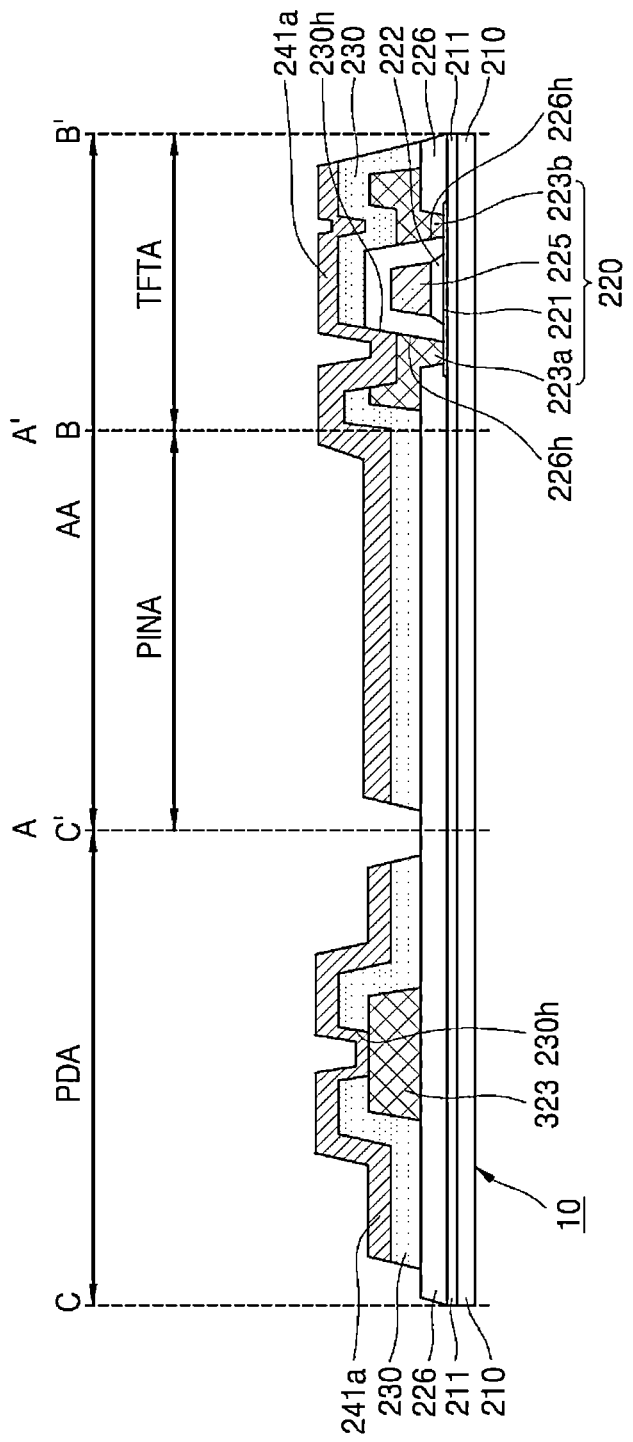
FIG. 10A to FIG. 10E are process cross-sectional view of a manufacturing method of an array substrate for a digital X-ray detector corresponding to a single pixel area and a digital X-ray detector including the same according to another embodiment of the present disclosure.

As shown in FIG. 9A and FIG. 10A, the thin-film transistor 220 is formed in the active area AA and on the base substrate 210.

The thin-film transistor 220 formed on the base substrate 210 is formed to include the active layer 221, the first electrode 223a, the second electrode 223b, and the gate electrode 225.

The active layer 221 may be formed on the buffer layer 211 formed on the base substrate 210.

The gate insulating layer 222 having a pattern corresponding to the gate electrode 225 may be formed on the active layer 221. The gate electrode 225 may be formed on the gate insulating layer 222.

The interlayer insulating layer 226 may be formed on the gate electrode 225 and over the entire face of the base substrate 210 including the active area AA and the pad area PDA to cover the gate electrode 225.

The first electrode 223a and the second electrode 223b may be formed on the interlayer insulating layer 226. Moreover, the first electrode 223a and the second electrode 223b are electrically connected to the active layer 221, respectively, via the interlayer insulating layer contact-holes 226h.

The first protective layer 230 is formed on the thin-film transistor 220 and over the base substrate 210 to cover the thin-film transistor 220.

The first protective layer 230 is formed over the entire face of the base substrate 210 including the active area AA and the pad area PDA.

The lower electrode film 241a may be deposited on the first protective layer 230.

The lower electrode film 241a is formed over the entire face of the base substrate 210 including the active area AA and the pad area PDA.

In one example, in the pad area PDA, the pad electrode 323 is formed on the base substrate 210.

Specifically, the pad electrode 323 may be formed before forming the first protective layer 230. The pad electrode 323 may be formed between the interlayer insulating layer 226 and the first protective layer 230.

The pad electrode 323 in the pad area PDA may be formed using the same mask process in which the first electrode 223a and the second electrode 223b of the thin-film transistor 220 are formed in the active area AA.

Accordingly, the pad electrode 323 in the pad area PDA may be made of the same material as that of each of the first electrode 223a and the second electrode 223b of the thin-film transistor 220 in the active area AA. Moreover, the pad electrode 323 in the pad area PDA, and the first electrode 223a and the second electrode 223b of the thin-film transistor 220 disposed in the active area AA may constitute the same layer.

Figure 9B:
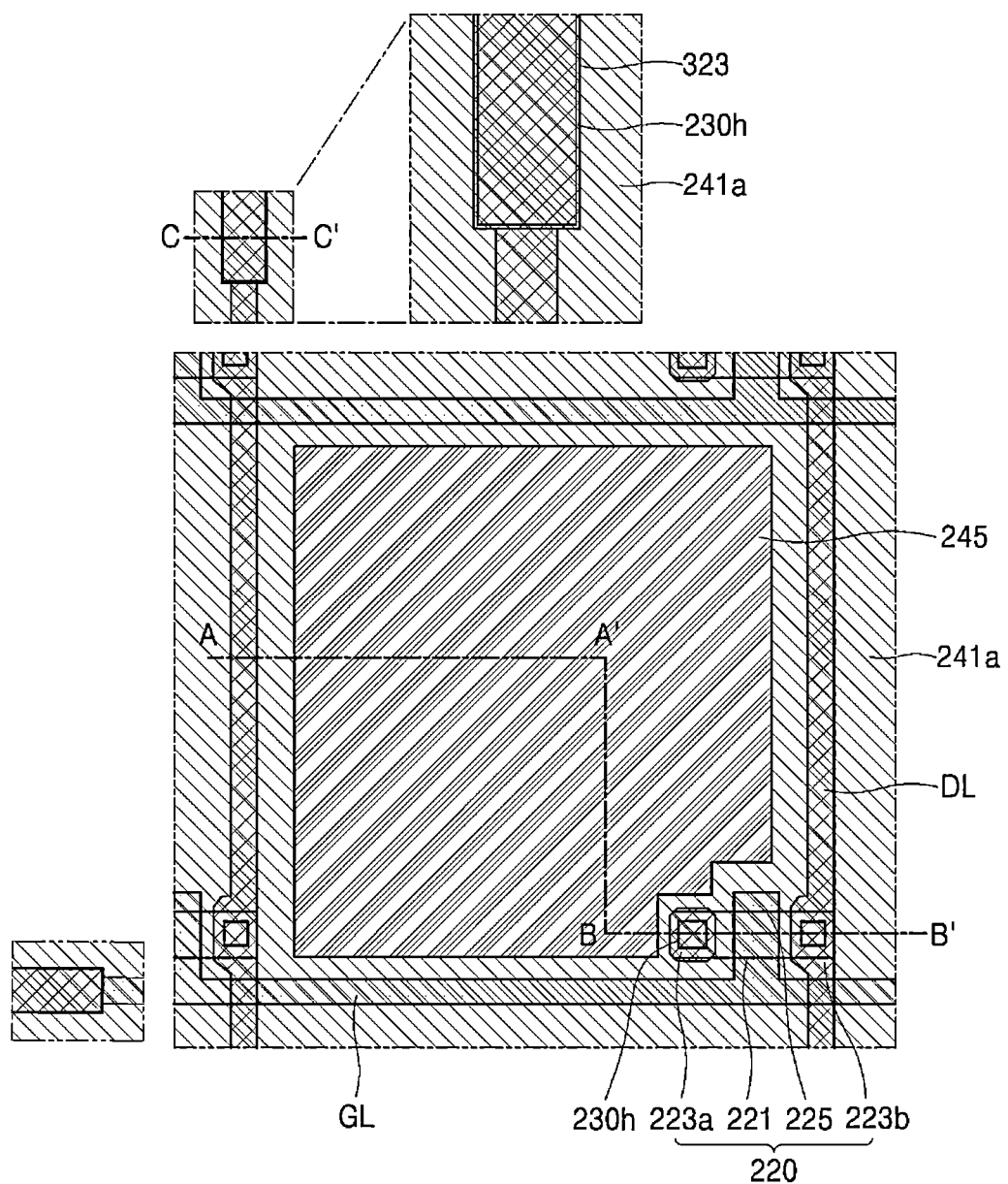
Figure 10B:
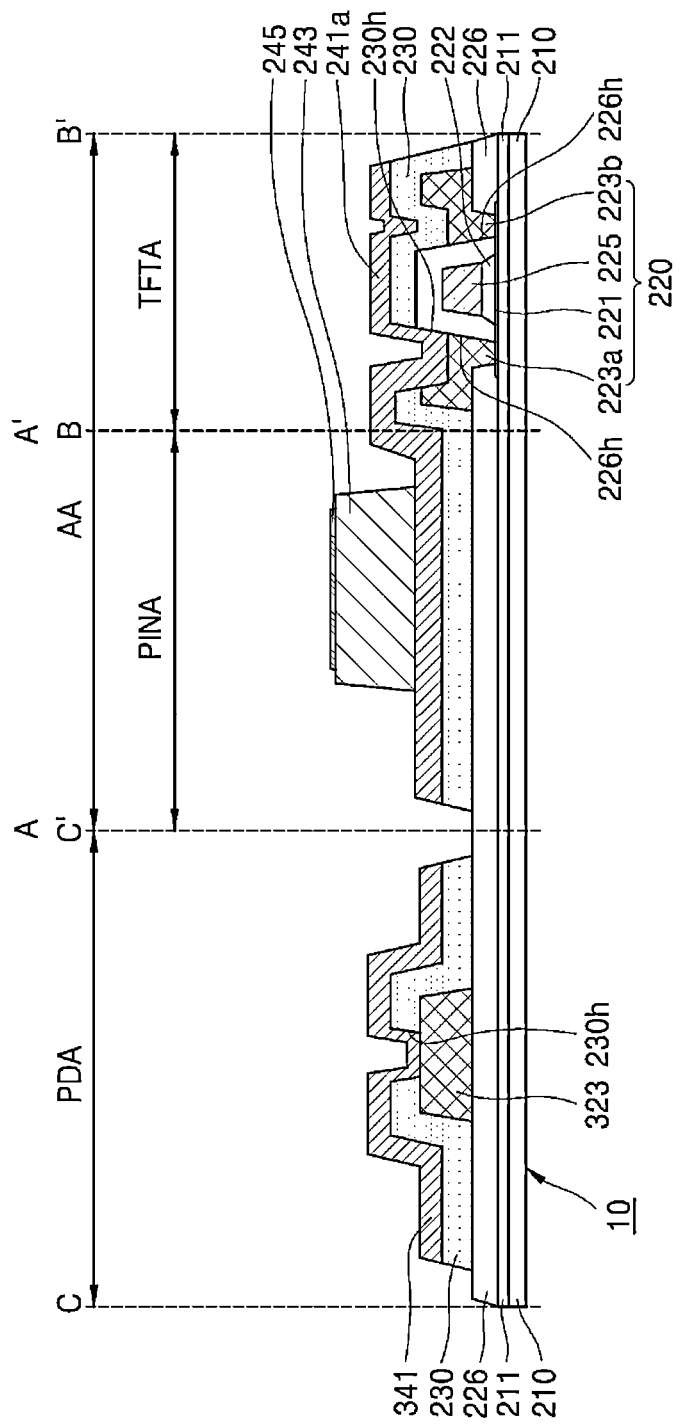

Next, as shown in FIGS. 9B and 10B, the PIN layer 243 and the upper electrode 245 are formed in the active area AA and on the lower electrode film 241a.

The PIN layer 243 and the upper electrode 245 are formed in the active area AA without performing a separate patterning process using a photolithography process after depositing the lower electrode film 241a.

The PIN layer 243 and the upper electrode 245 may be formed by performing a mask process including deposition and patterning processes.

For example, the PIN film and the upper electrode film may be deposited on the lower electrode film 241a to cover the entire face of the base substrate 210. Then, the PIN layer 243 and the upper electrode 245 may be formed by performing a patterning process using a mask having patterns corresponding to the PIN layer 243 and the upper electrode 245, respectively.

Because the upper electrode film is formed on the PIN film, the patterning process of the upper electrode film may be performed before the patterning process of the PIN film.

The patterning process for the upper electrode film may be carried out using a dry etching process, while the patterning process for the PIN film may be carried out using a wet etching process.

Figure 9C:
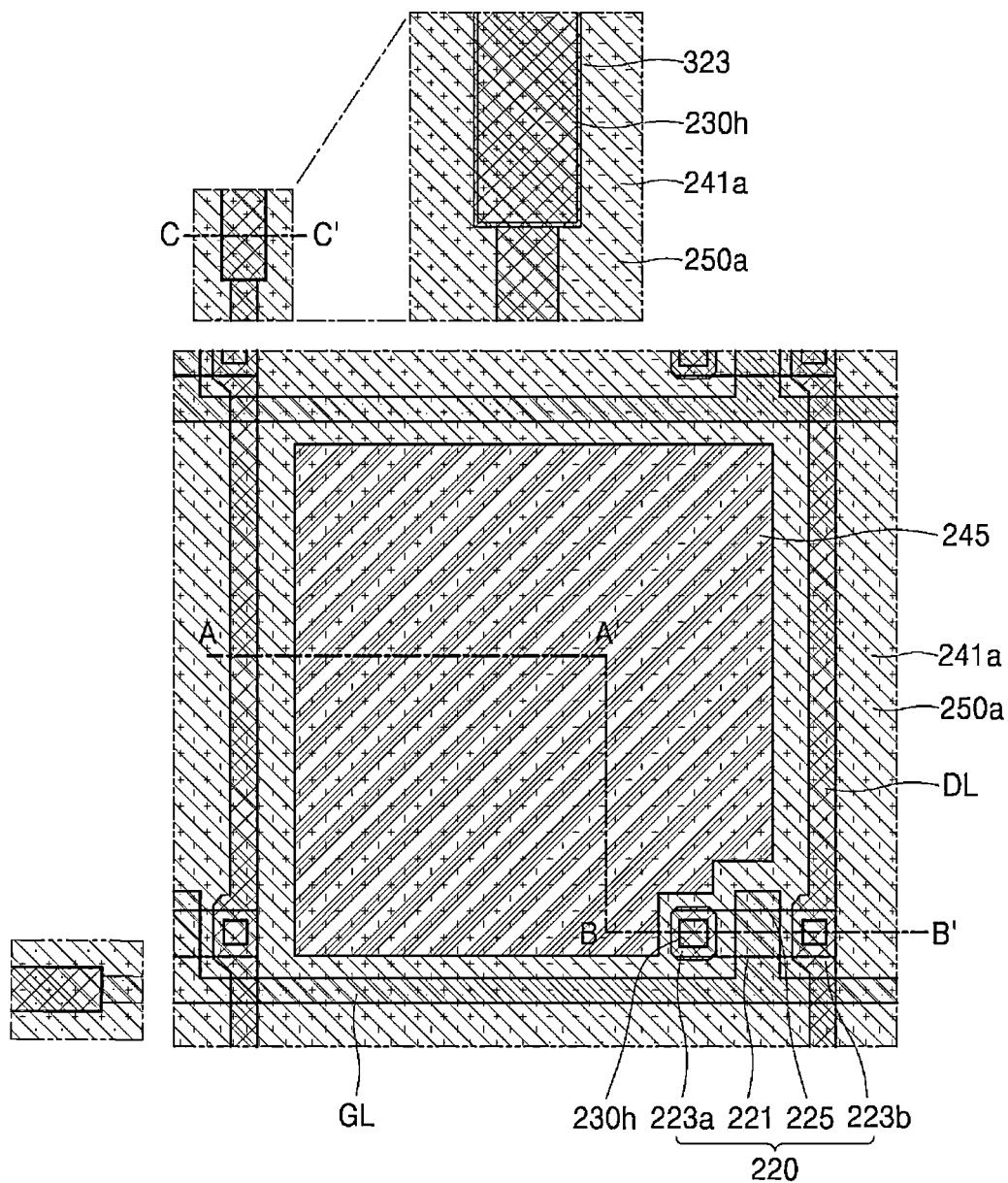
Figure 10C:
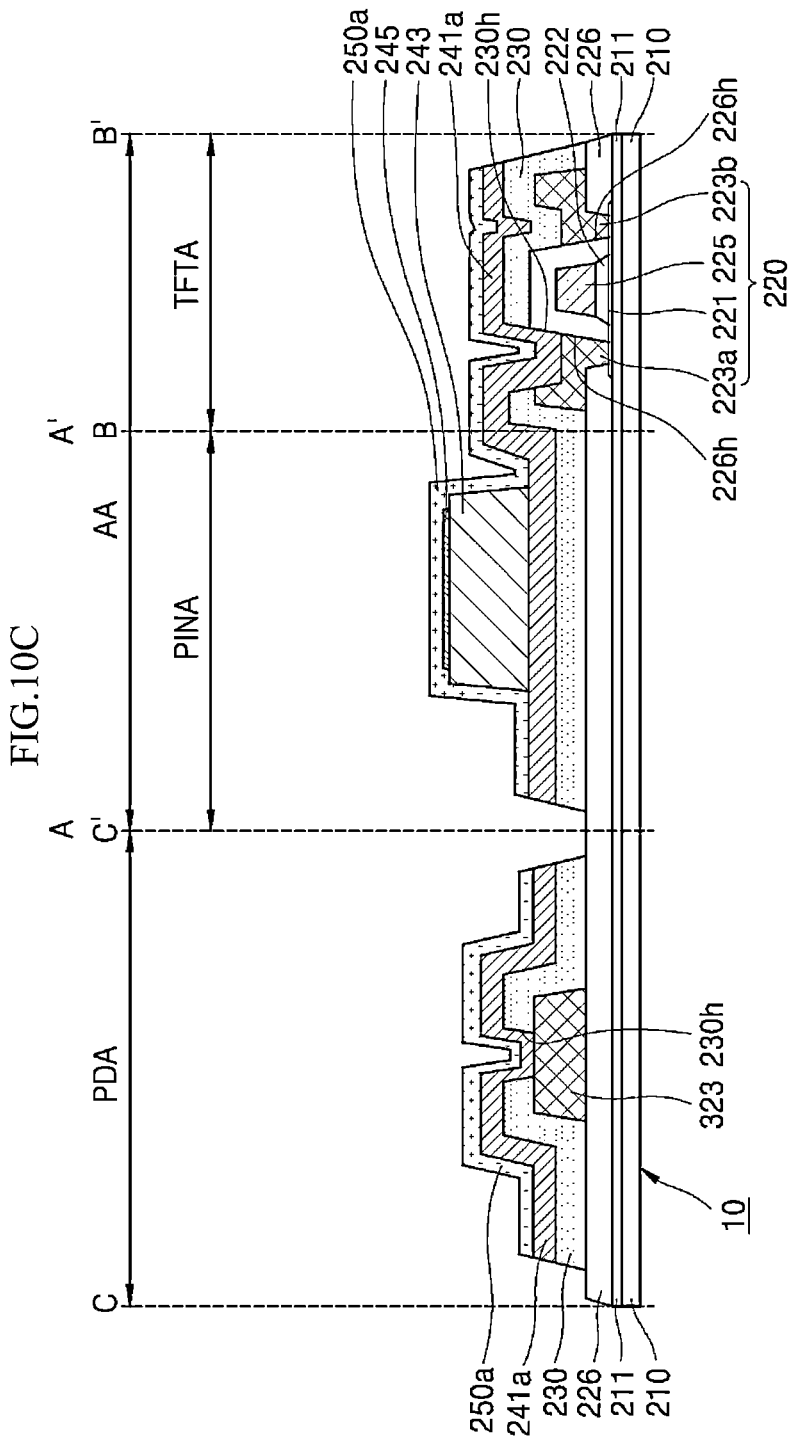

Next, as shown in FIG. 9C and FIG. 10C, the second protective film 250a is formed on the lower electrode film 241a to cover the PIN layer 243 and the upper electrode 245.

The second protective film 250a is deposited to cover the entire face of the base substrate 210 including the active area AA and the pad area PDA.

Figure 9D:
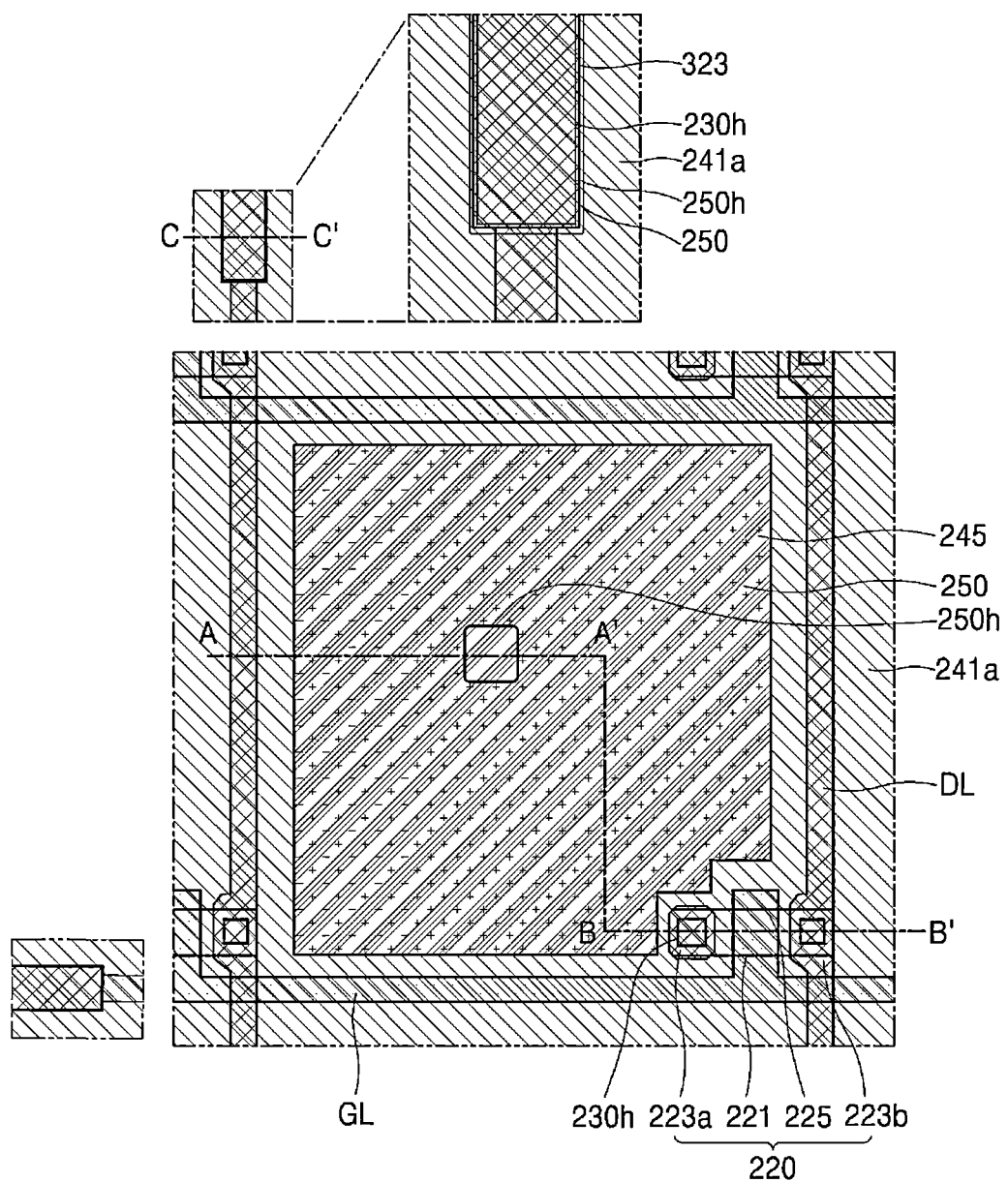
Figure 10D:
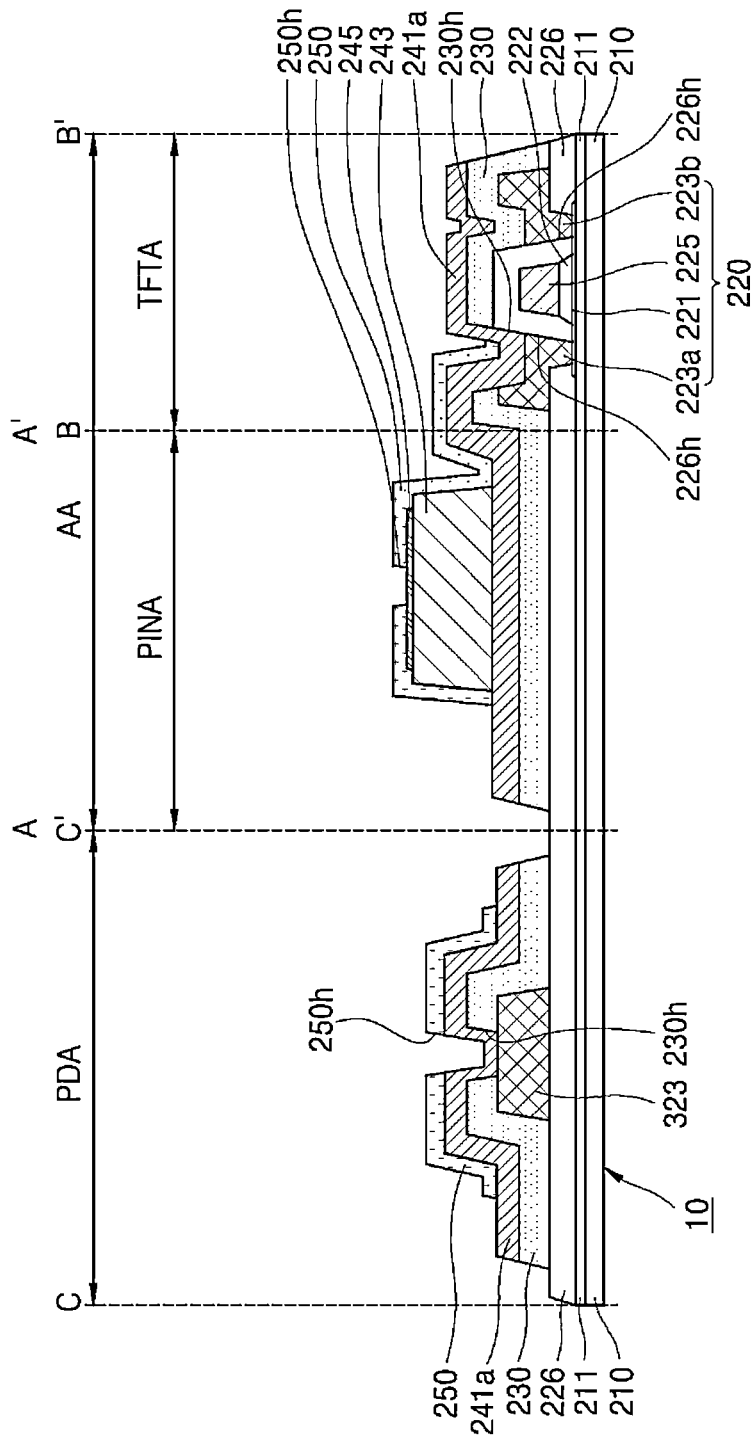

Next, as shown in FIG. 9D and FIG. 10D, the second protective layer 250 is formed by patterning the second protective film 250a.

Figure 9E:
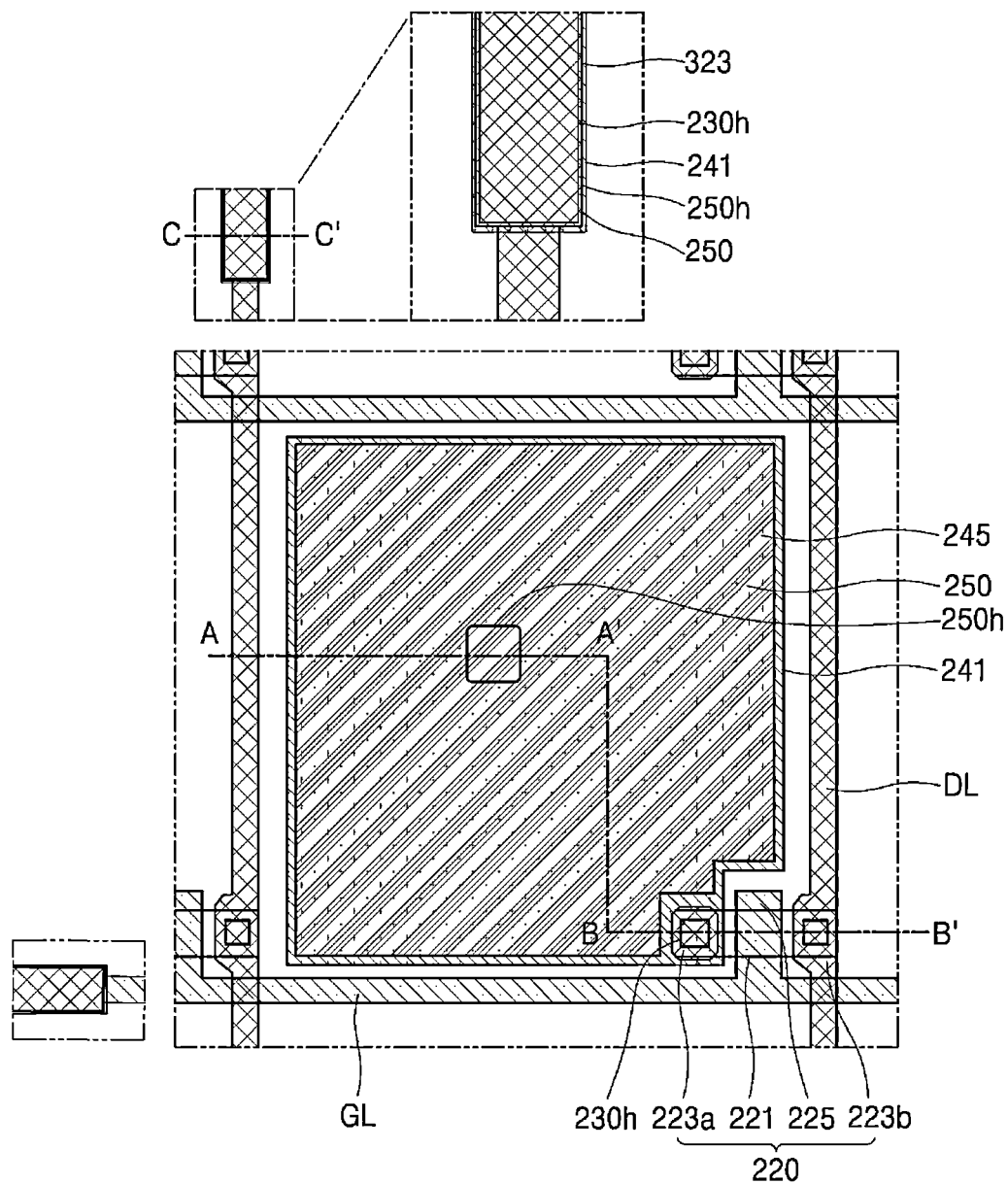
Figure 10E:
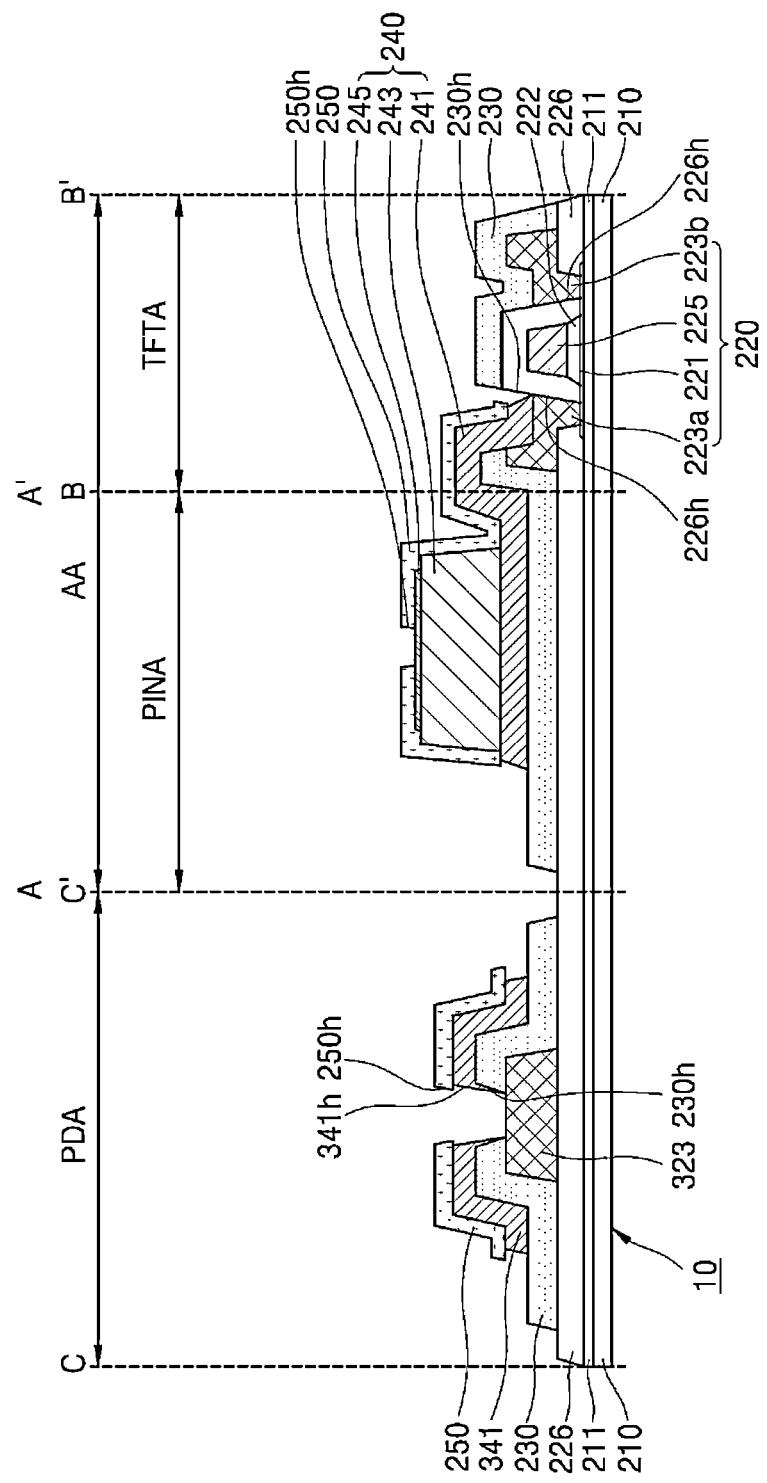

Moreover, as shown in FIG. 9E and FIG. 10E, the lower electrode 241 may be formed by patterning the lower electrode film 241a disposed in the active area AA. Moreover, the pad connection electrode 341 may be formed by patterning the lower electrode film 241a disposed in the pad area PDA.

In this case, the second protective film 250a and the lower electrode film 241a may be patterned using the same mask process.

The second protective film 250a and the lower electrode film 241a may be patterned using a single and same mask rather than using separate masks. Therefore, the patterning may be performed using a single and same mask process.

Specifically, the second protective film 250a is formed on the lower electrode film 241a. Then, the second protective film 250a is first patterned using a mask having a predefined pattern, and, subsequently, the lower electrode film 241a is patterned using the same mask as in the pattering process of the second protective film 250a.

The second protective film 250a may be patterned using dry etching, and the lower electrode film 241a may be patterned using wet etching.

The second protective film 250a patterned in this way may be formed into the second protective layer 250 in the active area AA and the pad area PDA. Moreover, the patterned lower electrode film 241a may act as the lower electrode 241 in the active area AA, and may act as the pad connection electrode 341 in the pad area PDA.

Therefore, the lower electrode 241 in the active area AA and the pad connection electrode 341 in the pad area PDA are formed using the same mask process.

As described above, according to the second embodiment, the lower electrode 241 of the PIN diode 240 and the second protective layer 250 covering the PIN diode 240 may be formed not using separate mask processes, but using the same mask process using the same mask, thereby reducing the number of mask processes, and thus improving the process efficiency.

Further, according to the second embodiment, a single mask process may be carried out such that the second protective layer 250 may be formed by patterning the second protective film 250a covering PIN diode 240 and then the lower electrode 241 may be formed by patterning the lower electrode film 241a. Thus, the problem caused in terms of the process may be removed.

In particular, after the second protective film 250a which protects the lower electrode film 241a is patterned, there is no need to change the mask process. Thus, the lower electrode film 241a may be patterned using the same mask process in a batch manner without the waiting time duration. Therefore, it is possible to reduce the increase in the foreign material or stain that may be otherwise present on the array substrate during the process of manufacturing the array substrate for the digital X-ray detector and the digital X-ray detector.

Further, according to the second embodiment, after forming the PIN layer 243 of the PIN diode 240, the second protective layer 250 covering the PIN diode 240 may be patterned such that the PIN diode 240 is protected with the second protective layer 250 while the second protective layer 250 does not cover the thin-film transistor 220.

That is, when an amount of the pattern of the second protective layer 250 formed on the thin-film transistor 220 is reduced as much as possible, an area not covered with the second protective layer 250 increases and thus hydrogen may be discharged through a wider discharge area. Thus, the dehydrogenation path from the thin-film transistor 220 may be wider. In this way, the wider dehydrogenation path of the thin-film transistor 220 is secured, such that the deterioration of the thin-film transistor 220 due to hydrogen may be reduced.

In a process of forming the PIN layer 243 of the PIN diode 240, a large amount of hydrogen may be produced. In this connection, the characteristics of the element may be deteriorated as the hydrogen flows into the underlying thin-film transistor 220.

In particular, the oxide semiconductor based thin-film transistor 220 which has the active layer 221 made of the oxide semiconductor is more susceptible to deterioration due to the hydrogen. Thus, it is necessary to secure the dehydrogenation path capable of discharging the hydrogen introduced in the process of forming the PIN layer 243 to the outside.

In accordance with the second embodiment, the second protective layer 250 formed to cover the PIN layer 243 after the PIN layer 243 is formed is not formed to cover the entire face of the base substrate 210. Rather, the second protective layer 250 may patterned into the pattern corresponding to the lower electrode 241 in the active area AA while the second protective layer 250 may be patterned to the pattern corresponding to the pad connection electrode 341 in the pad area PDA, such that the second protective layer 250 is formed to have the minimum pattern amount.

When the second protective layer 250 covers the entire face of the base substrate 210, the dehydrogenation path from the thin-film transistor 220 may not be secured due to the second protective layer 250. However, as in the second embodiment, when the second protective layer 250 is formed to have the minimum pattern amount, an area where the second protective layer 250 is not formed may act as the dehydrogenation path. Thus, a larger amount of hydrogen may be discharged from the thin-film transistor 220 to the outside via a subsequent heat treatment process.

Further, in accordance with the second embodiment, the second protective layer 250 may be patterned to have the same pattern as that of the lower electrode 241. Therefore, the array substrate for the digital X-ray detector and the digital X-ray detector including the same may have constant and uniform panel characteristic, compared to the structure as in the first embodiment.

Figure 8:
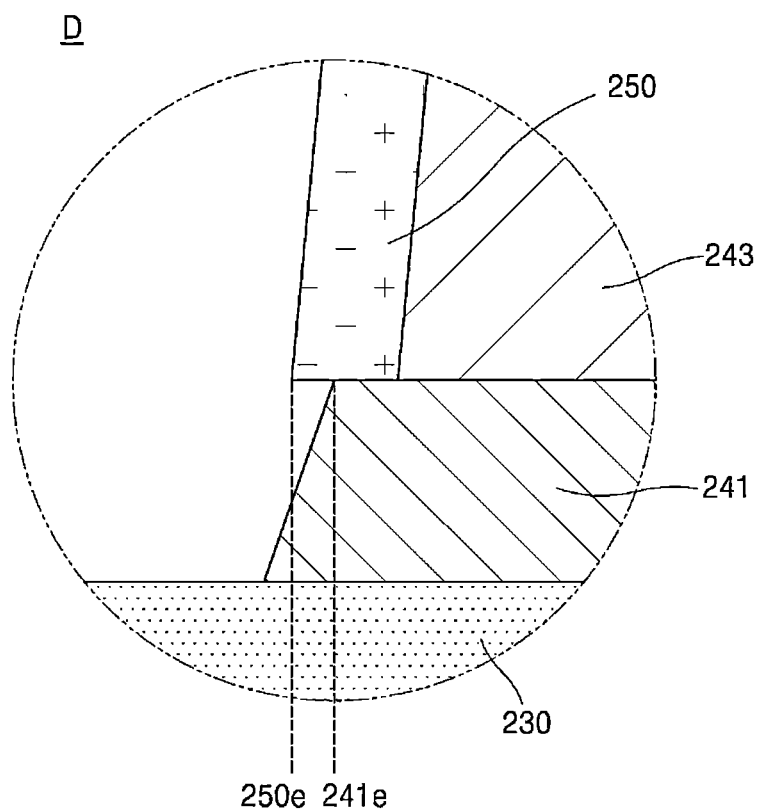
FIG. 8 is an enlarged cross-sectional view of a partial area of FIG. 7.

FIG. 8 is an enlarged cross-sectional view of a portion of an area where the second protective layer 250 and the lower electrode 241 are formed in FIG. 7.

As shown in FIG. 8, the second protective layer 250 does not contact the first protective layer 230.

As described above, in the second embodiment, the lower electrode film 241a and the second protective film 250a on the lower electrode film 241a may be patterned using a single mask process using the same mask. Therefore, in the active area AA, the second protective layer 250 formed by patterning the second protective film 250a may be formed in a pattern corresponding to that of the lower electrode 241 formed by patterning the lower electrode film 241a.

Similarly, in the pad area PDA, the second protective layer 250 formed by patterning the second protective film 250a may be formed in a pattern corresponding to that of the pad connection electrode 341 formed by patterning the lower electrode film 241a.

Therefore, the second protective layer 250 may not contact the first protective layer 230. The second protective layer 250 may be formed so as not to cover the side face of the lower electrode 241.

In this case, the second protective layer 250 and the lower electrode 241, and the second protective layer 250 and the pad connection electrode 341 may be patterned using the same mask process by the same mask, but may not have perfectly the same pattern as each other.

For example, as shown in FIG. 8, a side face of the lower electrode 241 may be inclined downwardly and outwardly. Moreover, a top end 241e of the lower electrode 241 may be positioned inwardly of a bottom end 250e of the second protective layer 250.

The second protective layer 250 may be patterned by dry etching the second protective film 250a. This patterning process of the second protective film 250a may also affect the lower electrode film 241a disposed under the second protective film 250a. Therefore, a partial area of the lower electrode film 241a disposed under the second protective film 250a may be etched away during the dry etching process for patterning the second protective film 250a.

In a subsequent wet etching of the lower electrode film 241a, the top end 241e of the lower electrode 241 may be subjected to both of the effect of the dry etching of the second protective film 250a and the effect of the wet etching of the lower electrode film 241a. Thus, the side face of the lower electrode 241 may be partially and excessively etched.

Accordingly, the side face of the lower electrode 241 may be inclined downwardly and outwardly. Moreover, the top end 241e of the lower electrode 241 may be positioned inwardly of the bottom end 250e of the second protective layer 250.

In the active area AA, the second protective layer 250 may be formed, and then, the planarization layer 260 may be formed thereon. Moreover, as shown in FIG. 7, the bias electrode 270 may be formed on the planarization layer 260.

The bias electrode 270 may be electrically connected to the upper electrode 245 of the PIN diode 240 via the contact-hole 260h of the planarization layer 260 and the contact-hole 250h of the second protective layer 250.

Referring to FIG. 7, the third protective layer 280 may be formed on the PIN diode 240, the planarization layer 260, and the bias electrode 270. Moreover, the scintillator layer 290 may be disposed on the third protective layer 280 and in the active area AA.

In one example, in the pad area PDA, the pad contact electrode 370 may be formed on the second protective layer 250.

The pad contact electrode 370 in the pad area PDA may be formed using the same mask process in which the bias electrode 270 in the active area AA is formed. Therefore, the pad contact electrode 370 may be made of the same material as that of the bias electrode 270 while the pad contact electrode 370 and the bias electrode 270 may constitute the same layer.

The pad contact electrode 370 may be electrically connected to the underlying pad electrode 323 via the first protective layer contact-hole 230h, the pad connection electrode contact-hole, and the second protective layer contact-hole 250h.

On the pad contact electrode 370 in the pad area PDA, the pad protective electrode 380 covering the pad contact electrode 370 may be formed.

The pad protective electrode 380 may act to reduce corrosion of the pad contact electrode 370 that may occur when the pad contact electrode 370 is exposed to the outside. To this end, the pad protective electrode 380 may include a material such as ITO. However, the present disclosure is not limited thereto. The pad protective electrode 380 may be made of a metal material resistant to corrosion.

In one example, in the gate pad area, prior to the formation of the pad electrode 323 using the same patterning process in which the first electrode 223a and the second electrode 223b are formed, a separate additional pad lower electrode may be formed using the same patterning process in which the gate electrode 225 is formed. The separate additional pad lower electrode and the gate electrode 225 may be made of the same material and may constitute the same layer.

In this case, the pad lower electrode in the gate pad area PDA may be disposed under the interlayer insulating layer 226.

The present disclosure may include following aspects and implementations thereof.

A first aspect of the present disclosure provides a method for manufacturing an array substrate for a digital X-ray detector, the method comprising: providing a base substrate having an active area and a pad area; forming a thin-film transistor on the base substrate and in the active area; forming a first protective layer on the base substrate so as to cover the thin-film transistor; forming a lower electrode film on the first protective layer; forming a PIN (P-type/I-type/N-type semiconductors) layer and an upper electrode on the lower electrode film and in the active area; forming a second protective film on the lower electrode film so as to cover the PIN layer and the upper electrode; and patterning the second protective film to form a second protective layer, and patterning the lower electrode film to form a lower electrode in the active area, wherein the second protective film and the lower electrode film are patterned using the same mask process.

In one implementation of the first aspect, each of the lower electrode film and the second protective film are formed to cover an entire face of the base substrate.

In one implementation of the first aspect, the second protective film is patterned, and, subsequently, the lower electrode film is patterned.

In one implementation of the first aspect, the second protective film is patterned using dry etching, while the lower electrode film is patterned using wet etching.

In one implementation of the first aspect, the method further comprises, prior to forming the first protective layer, forming a pad electrode on the base substrate and in the pad area.

In one implementation of the first aspect, the thin-film transistor includes an active layer, a first electrode, a second electrode and a gate electrode, wherein the pad electrode, the first electrode, and the second electrode are formed using the same mask process.

In one implementation of the first aspect, forming the lower electrode includes patterning the lower electrode film to form a pad connection electrode in the pad area.

In one implementation of the first aspect, the lower electrode and the pad connection electrode are formed using the same mask process.

In one implementation of the first aspect, the pad area includes a readout pad area.

In one implementation of the first aspect, the method further comprises, after forming the second protective layer and the lower electrode, forming a bias electrode and a pad contact electrode in the active area and the pad area, respectively, wherein the bias electrode and the pad contact electrode are formed using the same mask process.

In one implementation of the first aspect, the method further comprises forming a pad protective electrode covering the pad contact electrode in the pad area.

A second aspect of the present disclosure provides a method for manufacturing a digital X-ray detector, the method comprising: providing an array substrate for a digital X-ray detector; and forming a scintillator layer on the array substrate to cover an active area thereof, wherein providing the array substrate includes: providing a base substrate having an active area and a pad area; forming a thin-film transistor on the base substrate and in the active area; forming a first protective layer on the base substrate so as to cover the thin-film transistor; forming a lower electrode film on the first protective layer; forming a PIN (P-type/I-type/N-type semiconductors) layer and an upper electrode on the lower electrode film and in the active area; forming a second protective film on the lower electrode film so as to cover the PIN layer and the upper electrode; and patterning the second protective film to form a second protective layer, and patterning the lower electrode film to form a lower electrode in the active area, wherein the second protective film and the lower electrode film are patterned using the same mask process.

A third aspect of the present disclosure provides an array substrate for a digital X-ray detector, the array substrate comprising: a base substrate having an active area and a pad area; a thin-film transistor disposed on the base substrate and in the active area; a first protective layer covering the thin-film transistor and disposed in the active area and the pad area; a PIN diode electrically connected to the thin-film transistor and disposed on the first protective layer and in the active area; a second protective layer covering the PIN diode and disposed in the active area and the pad area; and a bias electrode electrically connected to the PIN diode and disposed on the second protective layer and in the active area, wherein the second protective layer does not contact the first protective layer.

In one implementation of the third aspect, the PIN diode includes a lower electrode, a PIN layer and an upper electrode, wherein the second protective layer does not cover a side face of the lower electrode.

In one implementation of the third aspect, a side face of the lower electrode is inclined downwardly and outwardly, wherein a top end of the lower electrode is positioned inwardly of a bottom end of the second protective layer.

In one implementation of the third aspect, the upper electrode is electrically connected to the bias electrode via a contact-hole formed in the second protective layer.

In one implementation of the third aspect, the thin-film transistor includes an active layer, a first electrode, a second electrode, and a gate electrode, wherein the array substrate further comprises: a pad electrode disposed in the pad area, wherein the pad electrode, the first electrode and the second electrode constitute the same layer; a pad connection electrode disposed in the pad area, wherein the pad connection electrode, and the lower electrode constitute the same layer; and a pad contact electrode disposed in the pad area, wherein the pad contact electrode, and the bias electrode constitute the same layer.

In one implementation of the third aspect, the array substrate further comprises a pad protective electrode disposed in the pad area, wherein the pad protective electrode covers the pad contact electrode.

A fourth aspect of the present disclosure provides a digital X-ray detector comprising: an array substrate for the digital X-ray detector; and a scintillator layer disposed on the array substrate to cover an active area thereof, wherein the array substrate for the digital X-ray detector includes: a base substrate having an active area and a pad area; a thin-film transistor disposed on the base substrate and in the active area; a first protective layer covering the thin-film transistor and disposed in the active area and the pad area; a PIN diode electrically connected to the thin-film transistor and disposed on the first protective layer and in the active area; a second protective layer covering the PIN diode and disposed in the active area and the pad area; and a bias electrode electrically connected to the PIN diode and disposed on the second protective layer and in the active area, wherein the second protective layer does not contact the first protective layer.

It will be apparent to those skilled in the art that various modifications and variations can be made in the present disclosure without departing from the technical idea or scope of the disclosure. Thus, it is intended that the present disclosure cover the modifications and variations of this disclosure provided they come within the scope of the appended claims and their equivalents.

What is claimed is:

1. A method for manufacturing an array substrate for a digital X-ray detector, the method comprising:

providing a base substrate having an active area and a pad area;

forming a thin-film transistor on the base substrate and in the active area;

forming a first protective layer on the base substrate so as to cover the thin-film transistor;

forming a lower electrode film on the first protective layer;

forming a PIN (P-type/I-type/N-type semiconductors) layer and an upper electrode on the lower electrode film and in the active area;

forming a second protective film on the lower electrode film so as to cover the PIN layer and the upper electrode; and patterning the second protective film to form a second protective layer, and patterning the lower electrode film to form a lower electrode in the active area after patterning the second protective film, wherein the second protective film and the lower electrode film are patterned using the same mask process.

2. The method of claim 1, wherein the second protective layer is patterned into a pattern corresponding to the lower electrode in the active area.

3. The method of claim 1, wherein each of the lower electrode film and the second protective film are formed to cover an entire face of the base substrate.

4. The method of claim 1, wherein the second protective film is patterned using a mask having a predefined pattern, and, subsequently, the lower electrode film is patterned using the same mask as in the pattering process of the second protective film.

5. The method of claim 4, wherein the second protective film is patterned using dry etching, while the lower electrode film is patterned using wet etching.

6. The method of claim 1, wherein the method further comprises, prior to forming the first protective layer, forming a pad electrode on the base substrate and in the pad area.

7. The method of claim 6, wherein the thin-film transistor includes an active layer, a first electrode, a second electrode and a gate electrode, wherein the pad electrode, the first electrode, and the second electrode are formed using the same mask process.

8. The method of claim 6, wherein forming the lower electrode includes patterning the lower electrode film to form a pad connection electrode in the pad area.

9. The method of claim 8, wherein the lower electrode and the pad connection electrode are formed using the same mask process.

10. The method of claim 8, wherein the second protective layer is patterned to a pattern corresponding to the pad connection electrode in the pad area.

11. The method of claim 8, wherein the method further comprises, after forming the second protective layer and the lower electrode, forming a bias electrode and a pad contact electrode in the active area and the pad area, respectively, wherein the bias electrode and the pad contact electrode are formed using the same mask process.

12. The method of claim 11, wherein the method further comprises forming a pad protective electrode covering the pad contact electrode in the pad area.

13. An array substrate for a digital X-ray detector, the array substrate comprising:

a base substrate having an active area and a pad area;

a thin-film transistor disposed on the base substrate and in the active area;

a first protective layer covering the thin-film transistor and disposed in the active area and the pad area;

a PIN diode electrically connected to the thin-film transistor and disposed on the first protective layer and in the active area; and a second protective layer covering the PIN diode and disposed in the active area and the pad area, wherein the second protective layer does not contact the first protective layer, wherein the PIN diode includes a lower electrode, a PIN layer and an upper electrode, and wherein the second protective layer is in contact with a part of the upper surface of the lower electrode and the second protective layer does not cover a side face of the lower electrode.

14. The array substrate of claim 13, wherein a side face of the lower electrode is inclined downwardly and outwardly, wherein a top end of the lower electrode is positioned inwardly of a bottom end of the second protective layer.

15. The array substrate of claim 13, further comprising a bias electrode electrically connected to the PIN diode and disposed on the second protective layer and in the active area, wherein the upper electrode is electrically connected to the bias electrode via a contact-hole formed in the second protective layer.

16. The array substrate of claim 15, wherein the thin-film transistor includes an active layer, a first electrode, a second electrode, and a gate electrode, wherein the array substrate further comprises:

a pad electrode disposed in the pad area, wherein the pad electrode, the first electrode and the second electrode constitute the same layer;

a pad connection electrode disposed in the pad area, wherein the pad connection electrode, and the lower electrode constitute the same layer; and a pad contact electrode disposed in the pad area, wherein the pad contact electrode, and the bias electrode constitute the same layer.

17. The array substrate of claim 16, wherein the array substrate further comprises a pad protective electrode disposed in the pad area, wherein the pad protective electrode covers the pad contact electrode.

18. A digital X-ray detector comprising:

an array substrate for the digital X-ray detector according to claim 13; and a scintillator layer disposed on the array substrate to cover an active area thereof.

* * * * *